United States Patent
Xian et al.

(10) Patent No.: US 11,916,083 B2
(45) Date of Patent: Feb. 27, 2024

(54) DISPLAY SUBSTRATE AND DISPLAY APPARATUS

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Jianbo Xian, Beijing (CN); Hongfei Cheng, Beijing (CN); Yongda Ma, Beijing (CN); Chen Xu, Beijing (CN); Xueguang Hao, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 428 days.

(21) Appl. No.: 17/274,213

(22) PCT Filed: Jun. 27, 2020

(86) PCT No.: PCT/CN2020/098345
§ 371 (c)(1),
(2) Date: Mar. 8, 2021

(87) PCT Pub. No.: WO2020/259647
PCT Pub. Date: Dec. 30, 2020

(65) Prior Publication Data
US 2021/0320130 A1    Oct. 14, 2021

(30) Foreign Application Priority Data

Jun. 27, 2019 (CN) .......................... 201910569693.9

(51) Int. Cl.
| | | |
|---|---|---|
| H01L 27/12 | (2006.01) | |
| G06V 40/13 | (2022.01) | |
| H01L 25/16 | (2023.01) | |
| H01L 25/18 | (2023.01) | |
| H01L 27/146 | (2006.01) | |
| H01L 27/15 | (2006.01) | |
| H10K 59/123 | (2023.01) | |

(Continued)

(52) U.S. Cl.
CPC ........ *H01L 27/124* (2013.01); *G06V 40/1318* (2022.01); *H01L 25/167* (2013.01);
(Continued)

(58) Field of Classification Search
CPC ...................................... H01L 27/124
See application file for complete search history.

(56) References Cited

U.S. PATENT DOCUMENTS 10,564,464 B2 * 2/2020 Wang ................ G02F 1/134309
2017/0278909 A1    9/2017 Jeon et al.
(Continued)

FOREIGN PATENT DOCUMENTS

| CN | 109858465 A | 6/2019 |
|---|---|---|
| CN | 110211975 A | 9/2019 |
| WO | WO2020073571 A1 | 4/2020 |

OTHER PUBLICATIONS

PCT International Search Report (w/ English translation) for corresponding PCT Application No. PCT/CN2020/098345, dated Oct. 9, 2020, 6 pages.
(Continued)

*Primary Examiner* — Douglas M Menz
(74) *Attorney, Agent, or Firm* — Dority & Manning, P.A.

(57) ABSTRACT

A display substrate has an active area which includes a photosensitive region with a light-transmitting channel. The display substrate includes a base, a pixel circuit layer, a first insulating layer and a conductive light-shielding layer. The pixel circuit layer includes pixel circuits and at least one pixel circuit includes a first thin film transistor and a second thin film transistor. The first insulating layer has a first via hole. The conductive light-shielding layer includes a conductive light-shielding pattern that has a first light-transmitting hole. Orthogonal projections of the first light-transmitting hole and of a gap region between the first thin film (Continued)

transistor and the second thin film transistor have a first overlapping region, which the light-transmitting channel penetrates. The conductive light-shielding pattern is coupled with a source electrode or a drain electrode of the first thin film transistor through the first via hole.

20 Claims, 9 Drawing Sheets

(51) Int. Cl.
 *H10K 59/126* (2023.01)
 *H10K 59/65* (2023.01)
(52) U.S. Cl.
 CPC ........ *H01L 25/18* (2013.01); *H01L 27/14678* (2013.01); *H01L 27/156* (2013.01); *H10K 59/123* (2023.02); *H10K 59/126* (2023.02); *H10K 59/65* (2023.02)

(56) References Cited

U.S. PATENT DOCUMENTS

| | | |
|---|---|---|
| 2018/0089491 A1 | 3/2018 | Kim et al. |
| 2019/0156097 A1 | 5/2019 | Liu et al. |
| 2019/0180071 A1 | 6/2019 | Kim |
| 2020/0020753 A1 | 1/2020 | Zhang et al. |
| 2020/0026899 A1 | 1/2020 | Sun et al. |
| 2020/0203468 A1 | 6/2020 | Zeng et al. |

OTHER PUBLICATIONS

Chinese Decision of Rejection (w/ English translation) for corresponding CN Application No. 201910569693.9, 8 pages.
Chinese First Office Action (w/ English translation) for corresponding CN Application No. 2019105696939, 12 pages.

* cited by examiner

DISPLAY SUBSTRATE AND DISPLAY APPARATUS

CROSS-REFERENCE TO RELATED APPLICATIONS

This application is a national phase entry under 35 USC 371 of International Patent Application No. PCT/CN2020/098345 filed Jun. 27, 2020, which claims priority to Chinese Patent Application No. 201910569693.9, filed Jun. 27, 2019, which are incorporated herein by reference in their entirety.

TECHNICAL FIELD

The present disclosure relates to the field of display technologies, and in particular, to a display substrate and a display apparatus.

BACKGROUND

With rapid development of display technologies, terminal devices having a fingerprint recognition function are used in many aspects of people's lives.

Existing fingerprint recognition methods include optical fingerprint recognition, ultrasonic fingerprint recognition, and capacitive fingerprint recognition. Taking the optical fingerprint recognition as an example, there are texture recognition units and a light-shielding layer in a display apparatus, and the display apparatus has a texture contact surface for contacting a user. The light-shielding layer is located between the fingerprint recognition units and the texture contact surface, and the light-shielding layer has pinholes.

A principle of the optical fingerprint recognition is that, after display light emitted from the display apparatus is incident on a finger of the user, the display light is reflected by valleys and ridges of the finger and incident onto the texture recognition unit(s) through the pinholes in the light-shielding layer. After receiving the display light reflected by the valleys and ridges, the texture recognition unit(s) convert optical signals into electrical signals. Since there is a difference between an intensity of display light reflected by the valleys and an intensity of display light reflected by the ridges, circuits in the texture recognition units form a texture image according to the electrical signals, and then compare the texture image with pre-stored texture information to complete fingerprint recognition.

SUMMARY

In an aspect, a display substrate is provided. The display substrate has an active area, and the active area includes a photosensitive region having a light-transmitting channel. The display substrate includes a base, a pixel circuit layer, a first insulating layer, and a conductive light-shielding layer. The pixel circuit layer is disposed on the base. The pixel circuit layer includes a plurality of pixel circuits located in the active area, and at least one pixel circuit includes a first thin film transistor and a second thin film transistor. The first insulating layer is disposed on a side of the pixel circuit layer away from the base. The first insulating layer has a first via hole. The conductive light-shielding layer is disposed on a side of the first insulating layer away from the base.

In some embodiments, the first insulating layer further having a second via hole, the first via hole and the second hole are respectively located on two opposite sides of the first light-transmitting hole.

The conductive light-shielding layer includes a conductive light-shielding pattern that has a first light-transmitting hole located in the photosensitive region; an orthogonal projection of the first light-transmitting hole on the base and an orthogonal projection of a gap region between the first thin film transistor and the second thin film transistor on the base have a first overlapping region. The light-transmitting channel is perpendicular to the base and penetrates the first overlapping region. The conductive light-shielding pattern is coupled with a source electrode or a drain electrode of the first thin film transistor through the first via hole.

In some embodiments, the conductive light-shielding pattern is coupled with one of the source electrode and the drain electrode, proximate to the first light-transmitting hole, of the first thin film transistor through the first via hole. The first insulating layer further has a second via hole. One of a source electrode and a drain electrode, proximate to the first light-transmitting hole, of the second thin film transistor includes an active layer connection portion and a dummy portion that are electrically insulated from each other, and the dummy portion is closer to the first light-transmitting hole than the active layer connection portion. The active layer connection portion is coupled with an active layer of the second thin film transistor. The conductive light-shielding pattern is coupled with the dummy portion through the second via hole.

In some embodiments, the conductive light-shielding pattern includes a first light-shielding sub-pattern and a second light-shielding sub-pattern that are electrically insulated from each other. The first light-shielding sub-pattern is coupled with one of the source electrode and the drain electrode, proximate to the first light-transmitting hole, of the first thin film transistor through the first via hole. The first insulating layer further has a second via hole. The second light-shielding sub-pattern is coupled with one of a source electrode and a drain electrode, proximate to the first light-transmitting hole, of the second thin film transistor through the second via hole.

In some embodiments, the first light-transmitting hole is located in the first light-shielding sub-pattern; or, the first light-transmitting hole is located in the second light-shielding sub-pattern; or one part of the first light-transmitting hole is located in the first light-shielding sub-pattern, and another part of the first light-transmitting hole is located in the second light-shielding sub-pattern, so that the first light-shielding sub-pattern and the second light-shielding sub-pattern cooperate to form the first light-transmitting hole.

In some embodiments, a diameter of the first via hole is equal to a diameter of the second via hole.

In some embodiments, the first via hole and the second via hole are symmetrical relative to a central axis of the light-transmitting channel.

In some embodiments, in a direction pointing from the first via hole to the second via hole, a dimension of a portion of the conductive light-shielding pattern located on one side of the first light-transmitting hole is approximately equal to a dimension of a portion of the conductive light-shielding pattern located on an opposite side of the first light-transmitting hole.

In some embodiments, the display substrate further includes a second insulating layer and a conductive electrode layer. The second insulating layer is disposed on a side of the conductive light-shielding layer facing away from the base, the second insulating layer having a third via hole and a fourth hole. The conductive electrode layer is disposed on a side of the second insulating layer facing away from the base.

The conductive electrode layer includes a conductive electrode, the conductive electrode has a second light-transmitting hole located in the photosensitive region; an orthogonal projection of the second light-transmitting hole on the base and an orthogonal projection of the first light-transmitting hole on the base have a second overlapping region. The light-transmitting channel is further penetrates the second overlapping region. The conductive electrode is coupled with the conductive light-shielding pattern through the third via hole. The third via hole and the fourth hole are respectively located on two opposite sides of the second light-transmitting hole.

In some embodiments, one of a source electrode and a drain electrode, proximate to the first light-transmitting hole, of the second thin film transistor includes an active layer connection portion and a dummy portion. The active layer connection portion is coupled with an active layer of the second thin film transistor. The dummy portion is closer to the first light-transmitting hole than the active layer connection portion. The dummy portion and the active layer connection portion are electrically insulated from each other. The conductive light-shielding pattern is coupled with one of the source electrode and the drain electrode, proximate to the first light-transmitting hole, of the first thin film transistor through the first via hole, and is further coupled with the dummy portion through the second via hole. The conductive electrode is coupled with the conductive light-shielding pattern through the fourth via hole.

In some embodiments, the conductive light-shielding pattern includes a first light-shielding sub-pattern and a second light-shielding sub-pattern. The first light-shielding sub-pattern is coupled with one of the source electrode and the drain electrode, proximate to the first light-transmitting hole, of the first thin film transistor through the first via hole. The second light-shielding sub-pattern and the first light-shielding sub-pattern are electrically insulated from each other, and the second light-shielding sub-pattern is coupled with one of a source electrode and a drain electrode, proximate to the first light-transmitting hole, of the second thin film transistor through the second via hole. The conductive electrode includes a first conductive sub-electrode and a second conductive sub-electrode. The first conductive sub-electrode is coupled with the first light-shielding sub-pattern through the third via hole. The second conductive sub-electrode and the first conductive sub-electrode are electrically insulated from each other, and the second conductive sub-electrode is coupled with the second light-shielding sub-pattern through the fourth via hole.

In some embodiments, the second light-transmitting hole is located in the first conductive sub-electrode; or the second light-transmitting hole is located in the second conductive sub-electrode; or a part of the second light-transmitting hole is located in the first conductive sub-electrode, and another part of the second light-transmitting hole is located in the second conductive sub-electrode, so that the first conductive sub-electrode and the second conductive sub-electrode cooperate to form the second light-transmitting hole.

In some embodiments, a diameter of the third via hole is equal to a diameter of the fourth via hole.

In some embodiments, the third via hole and the fourth via hole are symmetrical relative to a central axis of the light-transmitting channel.

In some embodiments, in a direction pointing from the third via hole to the fourth via hole, a dimension of a portion of the conductive electrode located on one side of the second light-transmitting hole is approximately equal to a dimension of a portion of the conductive electrode located on an opposite side of the second light-transmitting hole.

In some embodiments, in the direction perpendicular to the base, the first via hole and the third via hole are staggered from each other, and the second via hole and the fourth via hole are staggered from each other.

In some embodiments, the display substrate further includes a light-emitting device layer disposed on a side of the second insulating layer away from the base, the light-emitting device layer including the conductive electrode layer, a light-emitting layer and a cathode layer that are sequentially stacked. The light-emitting device layer includes a plurality of light-emitting devices, each light-emitting device includes: an anode located in the conductive electrode layer, a light-emitting portion located in the light-emitting layer, and a cathode located in the cathode layer.

The pixel circuit includes: a switching transistor, a driving transistor, a first light-emitting control transistor, a second light-emitting control transistor and an initialization transistor, and the second light-emitting control transistor is coupled with the light-emitting device.

In some embodiments, the first thin film transistor is the first light-emitting control transistor; and the conductive light-shielding layer further includes a power signal line, the power signal line is coupled with the conductive light-shielding pattern; or the first thin film transistor is the second light-emitting control transistor, and the conductive electrode is the anode of the light-emitting device; or the first thin film transistor is the switching transistor; and the conductive light-shielding layer further includes a data signal line, the data signal line is coupled with the conductive light-shielding pattern; or the first thin film transistor is the initialization transistor; and the conductive light-shielding layer further includes an initialization signal line, the initialization signal line is coupled with the conductive light-shielding pattern.

In some embodiments, an orthographic projection of a channel region of the first thin film transistor on the base and an orthographic projection of a channel region of the second thin film transistor on the base are within an orthographic projection of the conductive light-shielding pattern on the base.

In some embodiments, the display substrate further includes a plurality of sub-pixels provided in the photosensitive region, the plurality of sub-pixels include sub-pixels of at least two colors, and not all areas of sub-pixels of different colors are equal. The first light-transmitting hole is located in at least one sub-pixel in each color of sub-pixels. Among sub-pixels of different colors, a ratio of an area of each first light-transmitting hole to an area of the sub-pixel in which the first light-transmitting hole is located is approximately a same.

In another aspect, a display apparatus is provided. The display apparatus includes: the display substrate according to any one of the above embodiments and at least one texture recognition device disposed on a side of the pixel circuit layer away from the first insulating layer. The at least one texture recognition device is located in the photosensitive region of the display substrate, and an orthogonal projection of at least one light-transmitting channel in the display substrate on the base is within an orthographic projection of the at least one texture recognition device on the base.

BRIEF DESCRIPTION OF THE DRAWINGS

In order to describe technical solutions in the present disclosure more clearly, accompanying drawings to be used in some embodiments of the present disclosure will be introduced below briefly. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, an actual process of a method and actual timings of signals that the embodiments of the present disclosure relate to.

DETAILED DESCRIPTION

Figure 1:
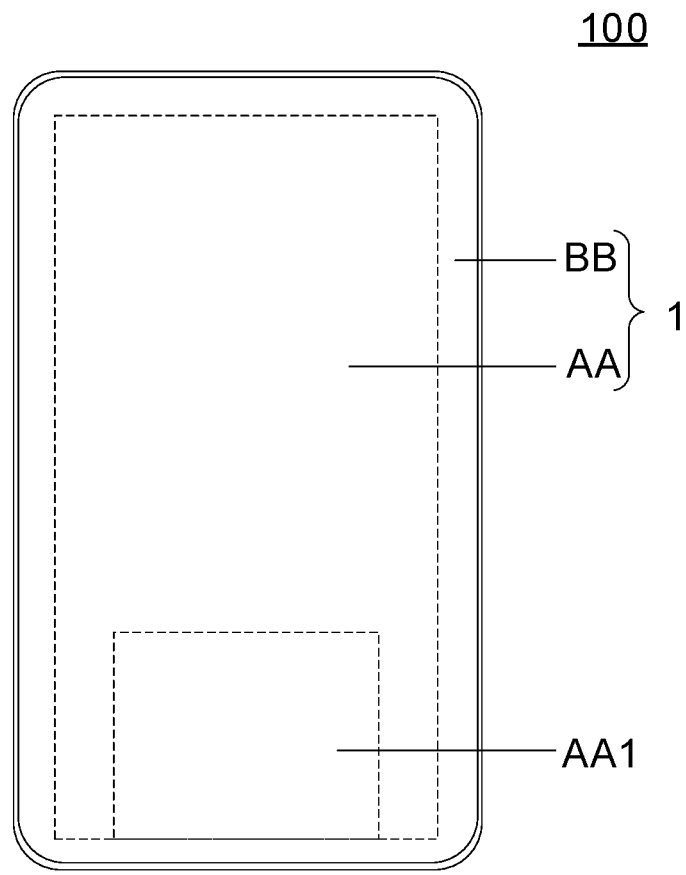
FIG. 1 is an illustration of a structure of a display apparatus, in accordance with some embodiments of the present disclosure.

Technical solutions in some embodiments of the present disclosure will be described below clearly and completely in combination with the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" throughout the description and the claims are construed as open and inclusive, i.e., "including, but not limited to". In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined as "first" and "second" may explicitly or implicitly include one or more of the features. In the description of the embodiments of the present disclosure, the terms "a plurality of" and "the plurality of" mean two or more unless otherwise specified.

In the description of some embodiments, the terms such as "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The use of the phrase "applicable to" or "configured to" herein means an open and inclusive language, which does not exclude devices that are applicable to or configured to perform additional tasks or steps.

The term "about" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the drawings, thicknesses of layers and regions may be exaggerated for clarity. Therefore, variations in shapes with respect to the drawings due to, for example, manufacturing techniques and/or tolerances are conceivable. Therefore, the exemplary embodiments should not be construed as being limited to the shapes of the regions shown herein, but include shape deviations due to, for example, manufacturing. For example, an etched region shown in a rectangular shape generally has a curved feature. Therefore, the regions illustrated in the drawings are schematic and their shapes are not intended to illustrate the actual shapes of the regions in a device and are not intended to limit the scope of the exemplary embodiments.

The present disclosure provides a display apparatus. The display apparatus may be used as a mobile phone, a tablet computer, a personal digital assistant (PDA), a vehicle-mounted computer, or the like, and specific use of the display apparatus is not specifically limited in embodiments of the present disclosure.

In some embodiments, the display apparatus may include, for example, a frame, a display panel, a circuit board, a cover plate, and other electronic accessories including a camera.

Taking an example where light of the display panel is emitted from a top thereof, the frame of the display apparatus may be a U-shaped frame, and the display panel and the circuit board are disposed in the frame. The cover plate is disposed on a light exit side (i.e., a display side) of the display panel, and the circuit board is disposed on a side of the display panel away from the cover plate.

The display panel may be an organic light-emitting diode (abbreviated as OLED) display panel, or a light-emitting diode (abbreviated as LED) display panel, or a quantum dot light-emitting diode (abbreviated as QLED) display panel.

In some embodiments, the display apparatus further includes at least one texture recognition device disposed on a non-display side of the display panel. The texture recognition device is configured to recognize a texture of a portion of a user in contact with a texture contact surface of the display apparatus. For example, in the display apparatus, the texture contact surface is the cover plate. For example, the cover plate is a light-transmitting cover plate, and in a case where a finger of the user is in contact with the texture contact surface, after display light emitted from the display apparatus is incident on the finger of the user, the display light is reflected by valleys and ridges of the finger and incident on the texture recognition device. Then, after receiving the light reflected by the valleys and the ridges of the finger, the texture recognition device converts optical signals into electrical signals. A circuit in the texture recognition device forms a texture image according to the electrical signals, and compares the texture image with pre-stored texture information to implement fingerprint recognition.

The texture recognition device can also recognize other textures besides the fingerprint, such as a palm print of a palm, which is not limited.

As shown in FIG. 1, taking an example where the display apparatus 100 is a mobile phone, the display apparatus 100 includes the display panel, and the display panel has an active area AA and a peripheral region BB arranged around the active area AA. The active area AA includes a photosensitive region AA1, and the texture recognition device is disposed in the photosensitive region AA1. The display panel has at least one light-transmitting channel disposed in the photosensitive region AA1, and an orthogonal projection of the at least one light-transmitting channel of the display panel on a base of the display panel 101 is within an orthographic projection of the texture recognition device on the base. As a result, after light emitted from the display panel is reflected by the portion of the user in contact with the texture contact surface of the display apparatus, the light passes through the at least one light-transmitting channel and is sensed by the texture recognition device, thereby implementing texture recognition.

Figure 2:
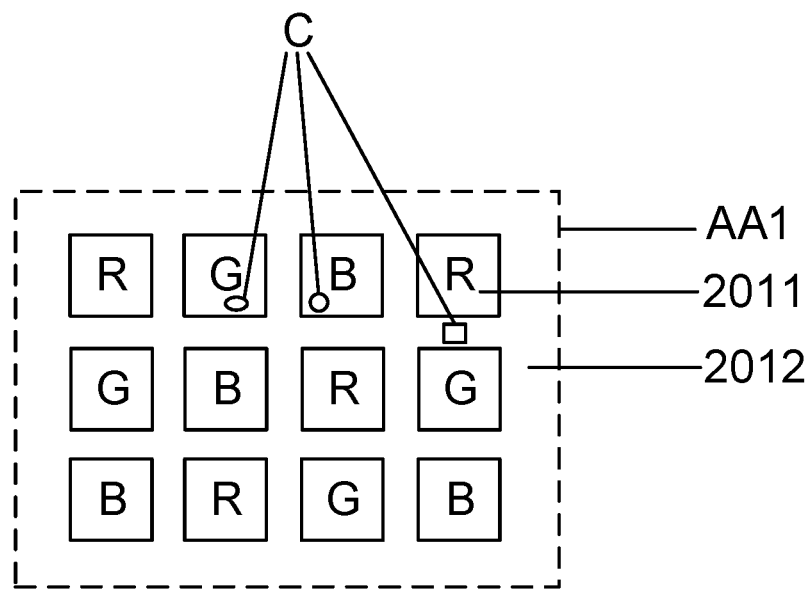
FIG. 2 is an illustration of a structure of a photosensitive region in a display apparatus, in accordance with some embodiments of the present disclosure.

As shown in FIG. 2, taking the photosensitive region AA1 of the display panel as an example, a plurality of sub-pixels are disposed in the active area AA of the display panel. That is, the active area AA includes a plurality of sub-pixel regions 2011, and the plurality of sub-pixel regions 2011 include red sub-pixel regions, green sub-pixel regions, and blue sub-pixel regions, or, the plurality of sub-pixel regions include magenta sub-pixel regions, yellow sub-pixel regions, and cyan sub-pixel regions.

On the above basis, the plurality of sub-pixel regions 2011 may further include white sub-pixel regions.

In addition to the plurality of sub-pixel regions 2011, the active area AA of the display panel further includes a non-sub-pixel region 2012, and the non-sub-pixel region 2012 includes gap regions between any two adjacent sub-pixel regions 2011.

In some embodiments, the at least one light-transmitting channel C may be disposed in at least one of the sub-pixel regions 2011 in the photosensitive region AA1. For example, each sub-pixel region 2011 is provided with a light-transmitting channel C, or the at least one light-transmitting channel C may be disposed in the non-sub-pixel regions 2012. The sub-pixel region 2011 may be understood as a region provided with a light-emitting device. Through the at least one light-transmitting channel C disposed in the photosensitive region AA1, the reflected light may pass through the at least one light-transmitting channel C and be incident on the texture recognition device 2, so as to be sensed by the texture recognition device 2, thereby implementing the texture recognition.

The embodiments of the present disclosure further provide a display substrate 1, and the display substrate 1 may be used as the above display panel 101 and applied to the display apparatus 100. Of course, the display substrate 1 may also be used as a display panel in other display apparatus, which is not specifically limited.

As shown in FIG. 1, the display substrate 1 has an active area and a peripheral region, and the active area includes a photosensitive region. As shown in FIG. 2, the photosensitive region AA1 has at least one light-transmitting channel C.

Figure 3:
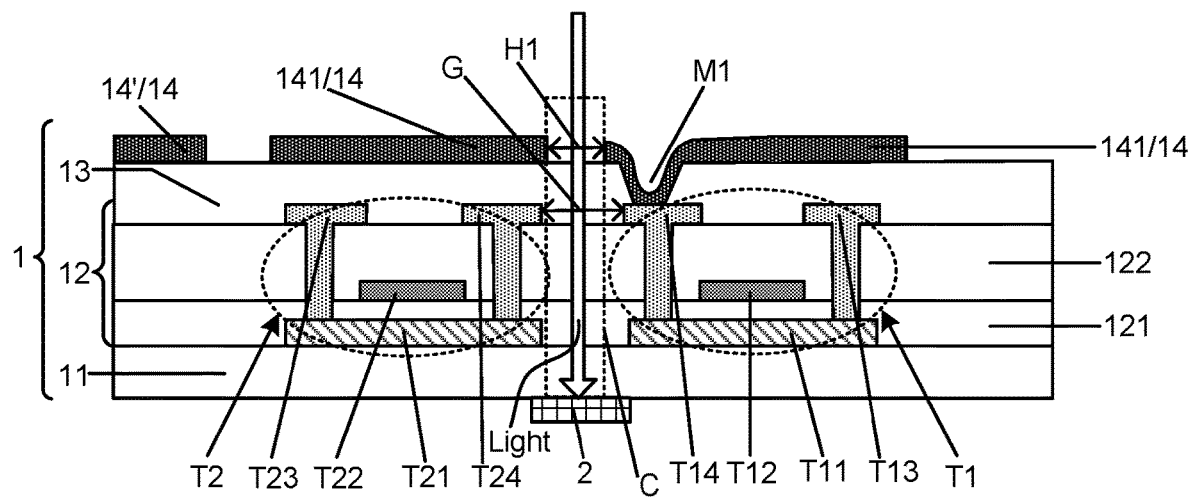
FIG. 3 is an illustration of a structure of a display substrate, in accordance with some embodiments of the present disclosure.

As shown in FIG. 3, the display substrate 1 includes a base 11, a pixel circuit layer 12, a first insulating layer 13 and a conductive light-shielding layer 14.

In some examples, the base 11 may be a rigid base, which may be made of glass, for example; or the base 11 may be a flexible base, which may be made of polyimide (abbreviated as PI), for example. On this basis, the flexible base may have a one-layer structure or a multi-layer structure.

In a case where the flexible base has the one-layer structure, a material of the layer includes PI. In a case where the flexible base has the multi-layer structure, the flexible base may include a plurality of flexible films and a plurality of spacer layers that are alternately stacked, and a material of the flexible films includes PI.

The pixel circuit layer 12 is disposed on the base 11. The pixel circuit layer 12 includes a plurality of pixel circuits located in the active area AA, and at least one pixel circuit includes a first thin film transistor T1 and a second thin film transistor T2.

Figure 19:
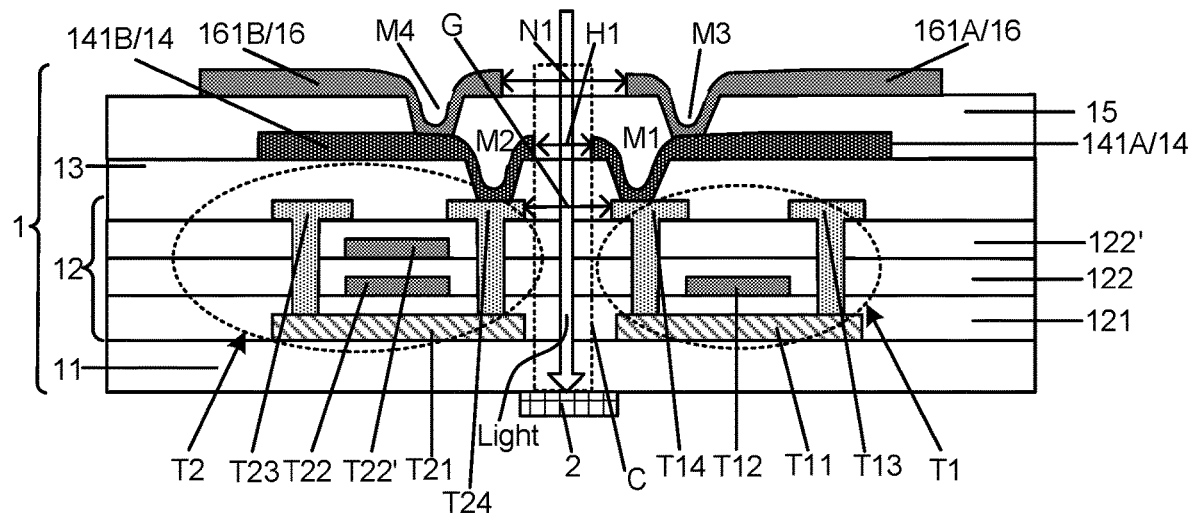
FIG. 19 is an illustration of a structure of yet another display substrate, in accordance with some embodiments of the present disclosure.

In some embodiments, the first thin film transistor T1 and the second thin film transistor T2 may be any of bottom-gate thin film transistors, top-gate thin film transistors, and double-gate thin film transistors (e.g., as shown in FIG. 19, the second thin film transistor T2 being a double-gate thin film transistor and including interlayer insulating layers 122 and 122'), which is not specifically limited.

It is taken as an example that the first thin film transistor T1 and the second thin film transistor T2 are both top-gate thin film transistors.

As shown in FIG. 3, the first thin film transistor T1 includes an active pattern T11, a portion of a gate insulating layer 121, a gate T12, a portion of an interlayer insulating layer 122, and a source electrode T13 and a drain electrode T14, which are all sequentially disposed on the base 11. The source electrode T13 and the drain electrode T14 are coupled with the active pattern T11 through via holes.

The second thin film transistor T2 includes an active pattern T21, a portion of the gate insulating layer 121, a gate T22, a portion of the interlayer insulating layer 122, and a source electrode T23 and a drain electrode T24, which are all sequentially disposed on the base 11. The source electrode T23 and the drain electrode T24 are coupled with the active pattern T21 through via holes.

The gate insulating layer 121 may be shared by the first thin film transistor T1 and the second thin film transistor T2. The interlayer insulating layer 122 may be shared by the first thin film transistor T1 and the second thin film transistor T2.

Materials of the active pattern T11 of the first thin film transistor T1 and the active pattern T21 of the second thin film transistor T2 may include one of an oxide, low temperature polycrystalline silicon (LTPS), amorphous silicon (a-Si) and a low temperature polycrystalline oxide (LTPO), or a combination thereof.

In a process of forming the active pattern, the a-Si may be crystallized into p-Si.

The oxide active pattern may be made of, for example, indium gallium zinc oxide (abbreviated as IGZO) or indium zinc oxide (IZO). The oxide active pattern may be at least one of an amorphous material, a quasi-crystalline material, or a crystalline material.

For example, the first thin film transistor T1 is a top-gate thin film transistor, and portions of the active pattern T11 in the first thin film transistor T1 that are in contact with the source electrode T13 and the drain electrode T14 are subjected to a treatment for converting them into conductors, so as to ensure that the active pattern T11 is in ohmic contact with the source electrode T13 and the drain electrode T14.

For example, the second thin film transistor T2 is a top-gate thin film transistor, and portions of the active pattern T12 in the second thin film transistor T2 that are in contact with the source electrode T23 and the drain electrode T24 are subjected to a treatment for converting them into conductors, so as to ensure that the active pattern T12 is in ohmic contact with the source electrode T23 and the drain electrode T24.

Of course, connections between thin film transistors in pixel circuits may also be implemented through a treatment to convert into conductors. For example, the first thin film transistor T1 and the second thin film transistor T2 are electrically connected through an active pattern subjected to the treatment for converting it into conductors.

Herein, concentration of carriers may be increased by means of doping, plasma treatment, and atmosphere annealing, so as to implement a treatment of converting the active pattern into a conductor.

A material and a thickness of the gate insulating layer 121 are not limited. The gate insulating layer 121 may be made of, for example, silicon dioxide or silicon nitride, or may be a stack of silicon dioxide and silicon nitride layers. Thicknesses of a silicon dioxide layer and a silicon nitride layer may be in a range from 50 nm to 150 nm.

Materials and thicknesses of the gate T12 of the first thin film transistor T1, and the gate T22 of the second thin film transistor T2 are not limited. The gates may be made of a metal or a transparent conductive oxide material. The thicknesses of the gates may be in a range from 200 nm to 400 nm.

Materials and thicknesses of the source electrode T13 and the drain electrode T14 of the first thin film transistor T1, and the source electrode T23 and the drain electrode T24 of the second thin film transistor T2 are not limited. The source electrodes and the drain electrodes may be made of a transparent conductive oxide material, a metal such as copper, molybdenum or aluminum, or an alloy. The thicknesses of the source electrodes and the drain electrodes may be in a range from 200 nm to 400 nm.

A layer where the source electrode T13 and drain electrode T14 of the first thin film transistor T1, and the source electrode T23 and drain electrode T24 of the second thin film transistor T2 are located is referred to as a first conductive layer. For example, the first conductive layer further includes signal lines, such as data lines and voltage signal lines.

Since there are a plurality of wires in the display substrate, in order to reduce resistance and improve signal transmission efficiency, another conductive layer referred to as a second conductive layer is added. An insulating layer may be disposed between the first conductive layer and the second conductive layer, and the first conductive layer and the second conductive layer are coupled through via holes.

As shown in FIG. 3, the first insulating layer 13 is disposed on a side of the pixel circuit layer 12 away from the base 11, and has first via holes M1.

The conductive light-shielding layer 14, which serves as the added second conductive layer mentioned above, is disposed on a side of the first insulating layer 13 away from the base 11, and has a light-shielding function.

In some embodiments, a material of the conductive light-shielding layer 14 is not limited.

For example, the conductive light-shielding layer 14 is made of a metal, an alloy material or other conductive material. For example, the conductive light-shielding layer 14 is made of a material including a metal such as titanium (Ti), aluminum (Al) or molybdenum (Mo), an alloy such as a Ti—Al alloy or a Mo—Al alloy, graphene, a conductive oxide (e.g., ITO or IGZO), or a conductive polymer material.

Figure 4:
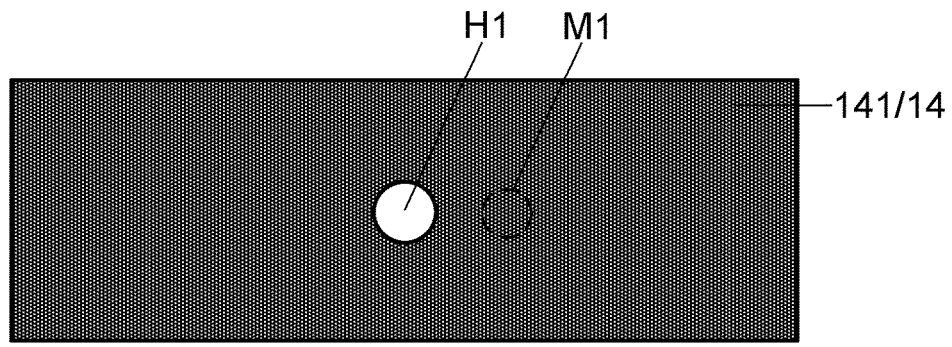
FIG. 4 is a top view illustration of a conductive light-shielding layer in the display substrate provided in FIG. 3.

As shown in FIGS. 3 and 4, the conductive light-shielding layer 14 includes conductive light-shielding patterns 141. For example, the conductive light-shielding pattern 141 in FIG. 3 is an integral structure, and has a first light-transmitting hole H1 located in the photosensitive region AA1. An orthogonal projection of the first light-transmitting hole H1 on the base 11 and an orthogonal projection of a gap region G between the first thin film transistor T1 and the second thin film transistor T2 on the base 11 has a first overlapping region, so that the first light-transmitting hole H1 cooperates with the gap region G between the first thin film transistor T1 and the second thin film transistor T2 to form at least a part of the light-transmitting channel C that is along a direction perpendicular to the base 11.

The conductive light-shielding pattern 141 is coupled with the source electrode T13 or the drain electrode T14 of the first thin film transistor T1 through the first via hole M1.

In this way, on one hand, the conductive light-shielding layer 14 has the conductive light-shielding pattern 141, which may be used for forming the first light-transmitting hole H1, so as to form a part of the light-transmitting channel C required for the texture recognition. On another hand, the conductive light-shielding layer 14 may further be coupled with the source electrode T13 or the drain electrode T14 of the first thin film transistor T1 for transmitting signals with the first thin film transistor T1. Owing to multiple functions of the conductive light-shielding layer 14, position for the thin film transistor or the metal layer structure may be more fully utilized, which may reduce a thickness of the display substrate 1 or the number of processes, and facilitate a thin design of the display apparatus in a case where the display substrate 1 is applied to the display apparatus.

In some embodiments, that the orthogonal projection of the gap region G between the first thin film transistor T1 and the second thin film transistor T2 on the base 11 and the orthogonal projection of the first light-transmitting hole H1 on the base 11 has the first overlapping region includes the following cases.

The orthogonal projection of the gap region G between the first thin film transistor T1 and the second thin film transistor T2 on the base 11 coincides with the orthogonal projection of the first light-transmitting hole H1 on the base 11.

Or, the orthogonal projection of the gap region G between the first thin film transistor T1 and the second thin film transistor T2 on the base 11 has a greater area than the orthogonal projection of the first light-transmitting hole H1 on the base 11, and the orthogonal projection of the gap region G between the first thin film transistor T1 and the second thin film transistor T2 on the base 11 thoroughly covers the orthogonal projection of the first light-transmitting hole H1 on the base 11.

Or, the orthogonal projection of the first light-transmitting hole H1 on the base 11 is a greater area than the orthogonal projection of the gap region G between the first thin film transistor T1 and the second thin film transistor T2 on the base 11, and the orthogonal projection of the first light-transmitting hole H1 on the base 11 thoroughly covers the orthogonal projection of the gap region G between the first thin film transistor T1 and the second thin film transistor T2 on the base 11.

Or, a part of the orthogonal projection of the first light-transmitting hole H1 on the base 11 and a part of the orthogonal projection of the gap region G between the first thin film transistor T1 and the second thin film transistor T2 on the base 11 overlap.

It will be understood that, in addition to the conductive light-shielding patterns 141 for forming the first light-transmitting hole H1, the conductive light-shielding layer 14 may further include functional signal lines, such as auxiliary lines 14', electrically connected to other signal lines.

Optionally, the auxiliary line 14' may be connected with a part of the conductive light-shielding pattern 141, or may be connected with the other signal lines. For example, the auxiliary lines 14' are electrically connected to at least one of data signal data lines, voltage signal (VDD) lines, or clock signal (CK) lines.

In the above embodiments, the conductive light-shielding pattern 141 is an integral structure, and the embodiments are described by taking an example in which the conductive light-shielding pattern 141 is coupled with the first thin film transistor T1 to transmit signals, and the conductive light-shielding pattern 141 is not coupled with the second thin film transistor T2 and does not transmit signals to the second thin film transistor T2. That is, signals received or transmitted by the second thin film transistor T2 are not from the conductive light-shielding pattern 141. If the conductive light-shielding pattern 141 is coupled with the second thin film transistor T2, a signal transmission error may occur.

Figure 5:
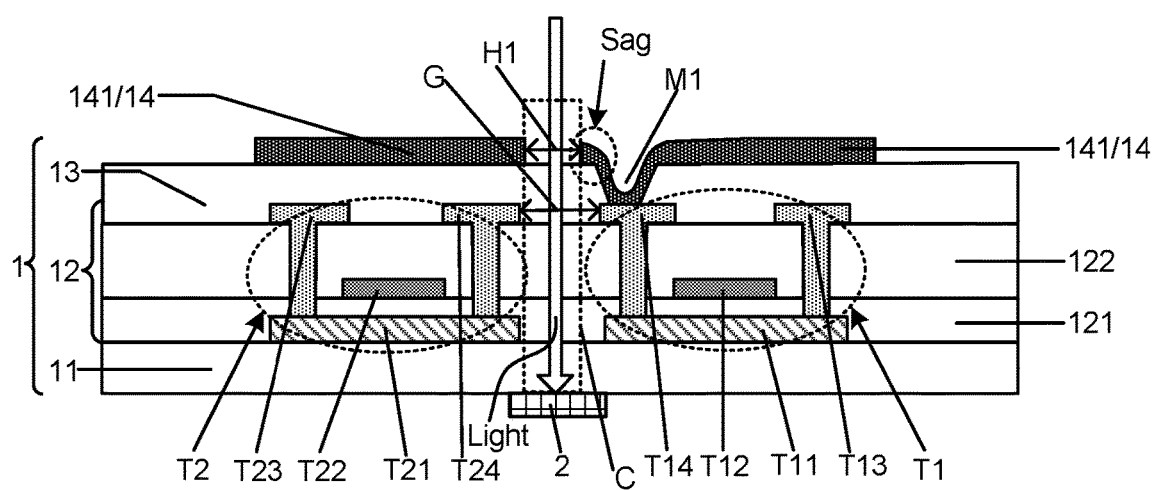
FIG. 5 is an illustration of a structure of another display substrate, in accordance with some embodiments of the present disclosure.

In some cases, inventors of the present disclosure have found that, as shown in FIG. 5, if a via hole (i.e., the first via hole M1) is provided on one side of the first light-transmitting hole H1, yet no via hole is provided on another side of the first light-transmitting hole H1, the metal layer structure and the like are prone to, e.g. sag, deform or tilt on the side provided with the via hole. Referring to FIG. 5, the conductive light-shielding pattern 141 "sags" at a periphery of the first via hole M1, which causes that a portion of the conductive light-shielding pattern 141 on a side of the first light-transmitting hole H1 proximate to the via hole is not in a same horizontal plane as portions of the conductive light-shielding pattern 141 on other sides of the first light-transmitting hole H1, thereby affecting the regularity of the shape of the formed light-transmitting channel C, and the accuracy of the texture recognition.

Figure 6:
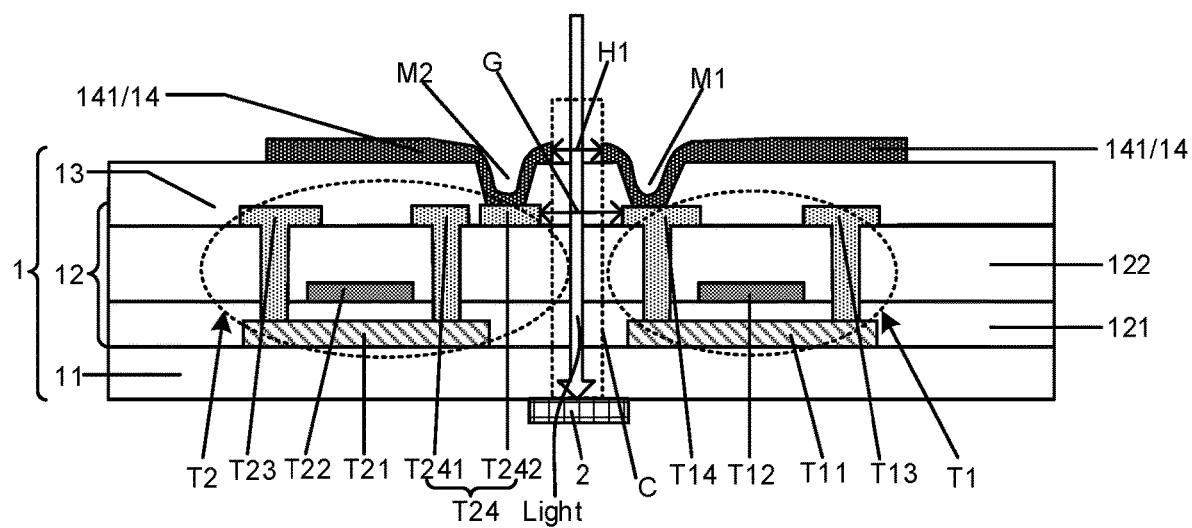
FIG. 6 is an illustration of a structure of yet another display substrate, in accordance with some embodiments of the present disclosure.
Figure 7A:
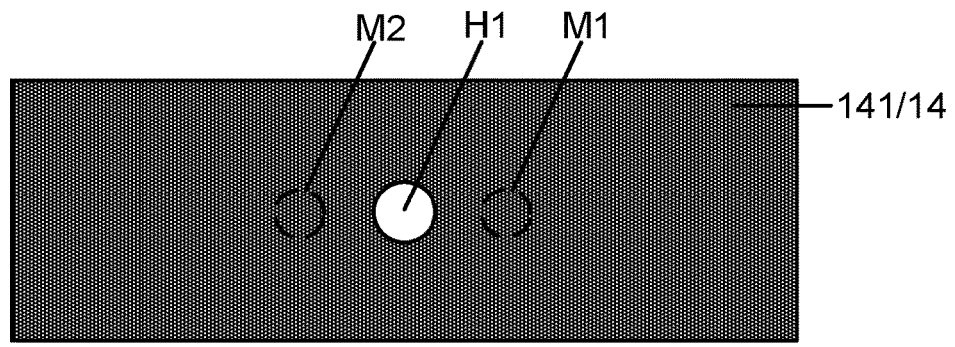
FIG. 7A is a top view illustration of a conductive light-shielding layer in the display substrate provided in FIG. 6.
Figure 7B:
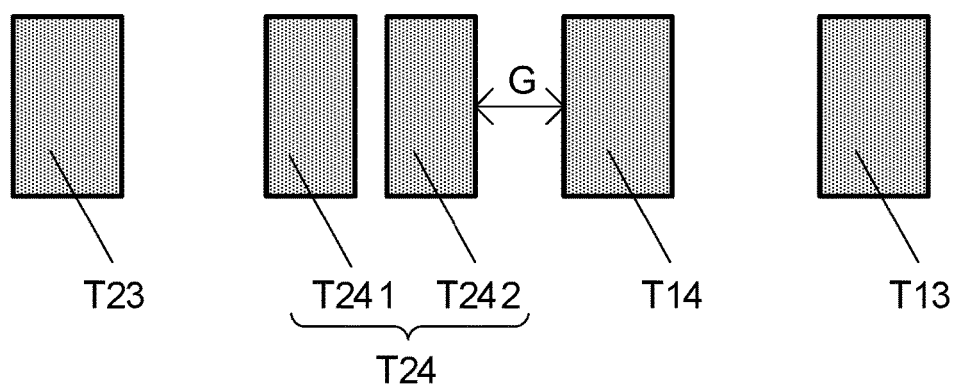
FIG. 7B is a top view illustration of source electrodes and drain electrodes of thin film transistors in the display substrate provided in FIG. 6.
Figure 8:
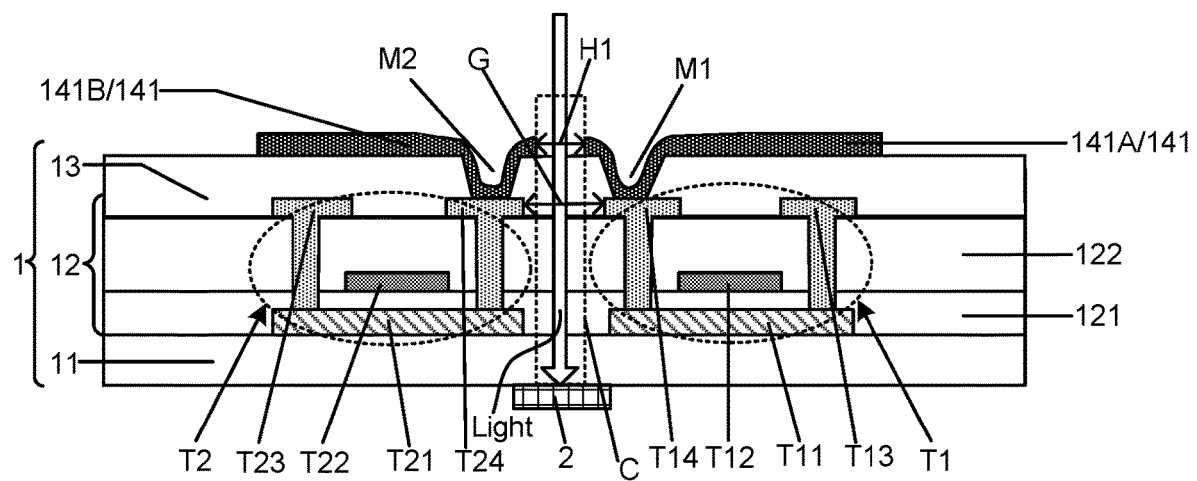
FIG. 8 is an illustration of a structure of yet another display substrate, in accordance with some embodiments of the present disclosure.

On this basis, in some embodiments, as shown in FIGS. 6, 7A and 7B, the conductive light-shielding pattern 141 is coupled with one of the source electrode T13 and the drain electrode T14 of the first thin film transistor T1 proximate to the first light-transmitting hole H1 through the first via hole M1. For example, the conductive light-shielding pattern 141 is coupled with the drain electrode T14 of the first thin film transistor T1 through the first via hole M1.

The first insulating layer 13 further has second via holes M2. One of the source electrode T23 and the drain electrode T24 of the second thin film transistor T2 proximate to the first light-transmitting hole H1 includes an active layer connection portion T241 and a dummy portion T242 that are electrically insulated from each other, and the dummy portion T242 is closer to the first light-transmitting hole H1 than the active layer connection portion T241.

The active layer connection portion T241 is coupled with the active pattern T21 of the second thin film transistor T2.

The conductive light-shielding pattern 141 is coupled with the dummy portion T242 through the second via hole M2.

In the above embodiments, by providing the via holes (i.e., the first via hole M1 and the second via hole M2) on both sides of the first light-transmitting hole H1, it is possible to improve a problem that portions of the conductive light-shielding pattern 141 on two opposite sides of the first light-transmitting hole H1 are not located in the same horizontal plane due to the sag of the conductive light-shielding pattern 141 at the via hole caused by providing the via hole on only one side of the first light-transmitting hole H1. It will be understood that, since the two sides of the first light-transmitting hole H1 are both provided with the via holes, the conductive light-shielding pattern 141 sags at the via holes on the two sides of the first light-transmitting hole H1, thereby offsetting a height difference between the portions of the conductive light-shielding pattern 141 on the two opposite sides of the first light-transmitting hole H1, and improving the accuracy of the texture recognition.

In addition, since the second thin film transistor T2 is not coupled with other portions of the conductive light-shielding pattern 141 other than the dummy portion T242, there is no signal transmission therebetween. By providing one of the source electrode T23 and the drain electrode T24 of the second thin film transistor T2 proximate to the first light-transmitting hole H1 to include the active layer connection portion T241 and the dummy portion T242 that are electrically insulated from each other, the conductive light-shielding pattern 141 is coupled with the dummy portion T242 through the via hole. Since the dummy portion T242 is separate from the other portions of the second thin film transistor T2, there is actually no signal transmission between the conductive light-shielding pattern 141 and the second thin film transistor T2. In this way, it is possible to not only solve the problem that the portions of the conductive light-shielding pattern 141 on the two opposite sides of the first light-transmitting hole H1 are not located in the same horizontal plane, but also avoid the signal transmission error caused by the signal transmission between the conductive light-shielding pattern 141 and the second thin film transistor T2.

In some other embodiments, as shown in FIGS. 8 and 9A to 9C, the conductive light-shielding pattern 141 includes a first light-shielding sub-pattern 141A and a second light-shielding sub-pattern 141B that are electrically insulated from each other.

The first light-shielding sub-pattern 141A is coupled with one of the source electrode T13 and the drain electrode T14 of the first thin film transistor T1 proximate to the first light-transmitting hole H1 through the first via hole M1. For example, the first light-shielding sub-pattern 141A is coupled with the drain electrode T14 of the first thin film transistor T1 through the first via hole M1.

The first insulating layer 13 further has the second via holes M2. The second light-shielding sub-pattern 141B is coupled with one of the source electrode T23 and the drain electrode T24 of the second thin film transistor T2 proximate to the first light-transmitting hole H1 through the second via hole M2. For example, the second light-shielding sub-pattern 141B is coupled with the drain electrode T24 of the second thin film transistor T2 through the second via hole M2.

In the above embodiments, by providing the via holes (i.e., the first via hole M1 and the second via hole M2) on both sides of the first light-transmitting hole H1, it is possible to improve the problem that the portions of the conductive light-shielding pattern 141 on the two opposite sides of the first light-transmitting hole H1 are not located in the same horizontal plane due to the sag of the conductive light-shielding pattern 141 at the via hole, which is caused by only providing the via hole on one side of the first light-transmitting hole H1. It will be understood that, since the two sides of the first light-transmitting hole H1 are both provided with the via holes, the conductive light-shielding pattern 141 sags at the via holes on the two sides of the first light-transmitting hole H1, thereby offsetting the height difference between the portions of the conductive light-shielding pattern 141 on the two opposite sides of the first light-transmitting hole H1, which may improve the accuracy of the texture recognition.

In addition, since the second thin film transistor T2 is not coupled with the conductive light-shielding pattern 141, there is no signal transmission therebetween. In this way, by dividing the conductive light-shielding pattern 141 into the first light-shielding sub-pattern 141A and the second light-shielding sub-pattern 141B that are electrically insulated from each other, and using the first light-shielding sub-pattern 141A as a portion of the conductive light-shielding pattern 141 for signal transmission with the thin film transistor, the first light-shielding sub-pattern 141A is coupled with the first thin film transistor T1 through the first via hole M1, thereby realizing the signal transmission between the first light-shielding sub-pattern 141A and the thin film transistor T1. Since the first light-shielding sub-pattern 141A and the second light-shielding sub-pattern 141B are electrically insulated from each other, even if the second light-shielding sub-pattern 141B is coupled with the second thin film transistor T2, the first light-shielding sub-pattern 141A and the second thin film transistor T2 are not coupled, and there is no signal transmission between the two. In this way, it is possible to not only solve the problem that the portions of the conductive light-shielding pattern 141 on the two opposite sides of the first light-transmitting hole H1 are not located in the same horizontal plane, but also avoid the signal transmission error caused by the signal transmission between the first light-shielding sub-pattern 141A of the conductive light-shielding pattern 141 and the second thin film transistor T2.

Figure 9A:
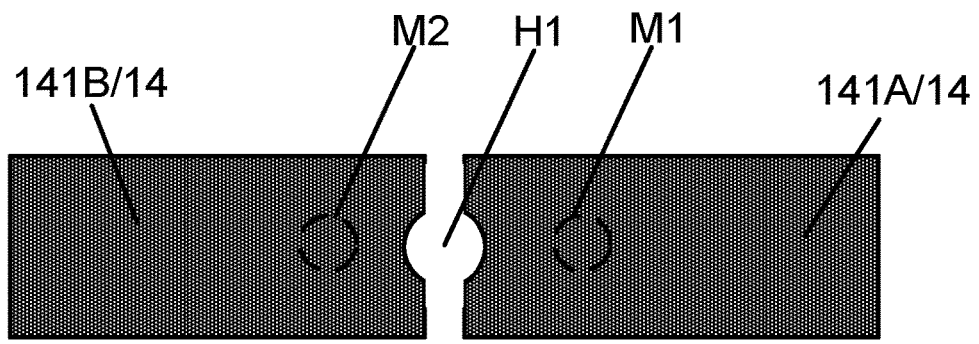
FIG. 9A is a top view illustration of a conductive light-shielding layer in the display substrate provided in FIG. 8.
Figure 9B:
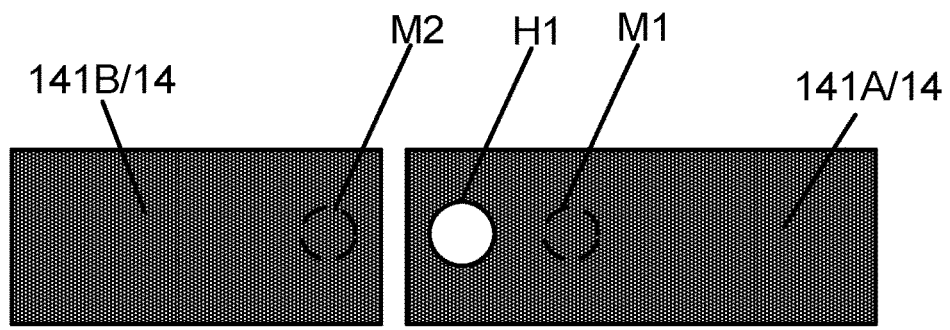
FIG. 9B is another top view illustration of the conductive light-shielding layer in the display substrate provided in FIG. 8.
Figure 9C:
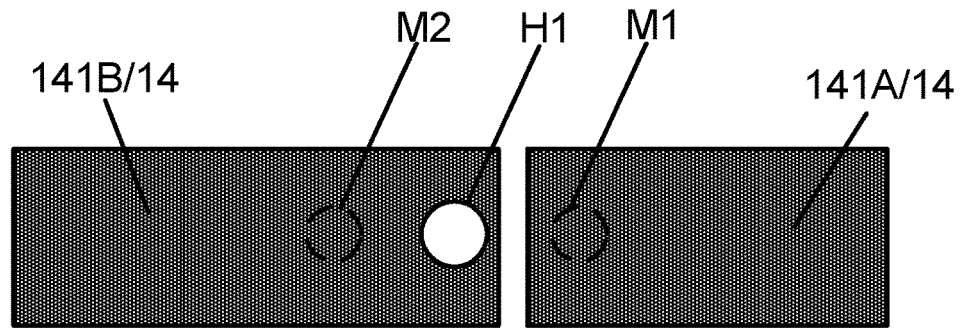
FIG. 9C is yet another top view illustration of the conductive light-shielding layer in the display substrate provided in FIG. 8.

In some embodiments, a positional relationship among the first light-transmitting hole H1, the first light-shielding sub-pattern 141A and the second light-shielding sub-pattern 141B includes the following cases. For example, as shown in FIG. 9B, the first light-transmitting hole H1 is located in the first light-shielding sub-pattern 141A. Or, as shown in FIG. 9C, the first light-transmitting hole H1 is located in the second light-shielding sub-pattern 141B. Or, as shown in FIG. 9A, a part of the first light-transmitting hole H1 is located in the first light-shielding sub-pattern 141A, and another part of the first light-transmitting hole H1 is located in the second light-shielding sub-pattern 141B, so that the first light-shielding sub-pattern 141A and the second light-shielding sub-pattern 141B cooperate to form the first light-transmitting hole H1.

Figure 10:
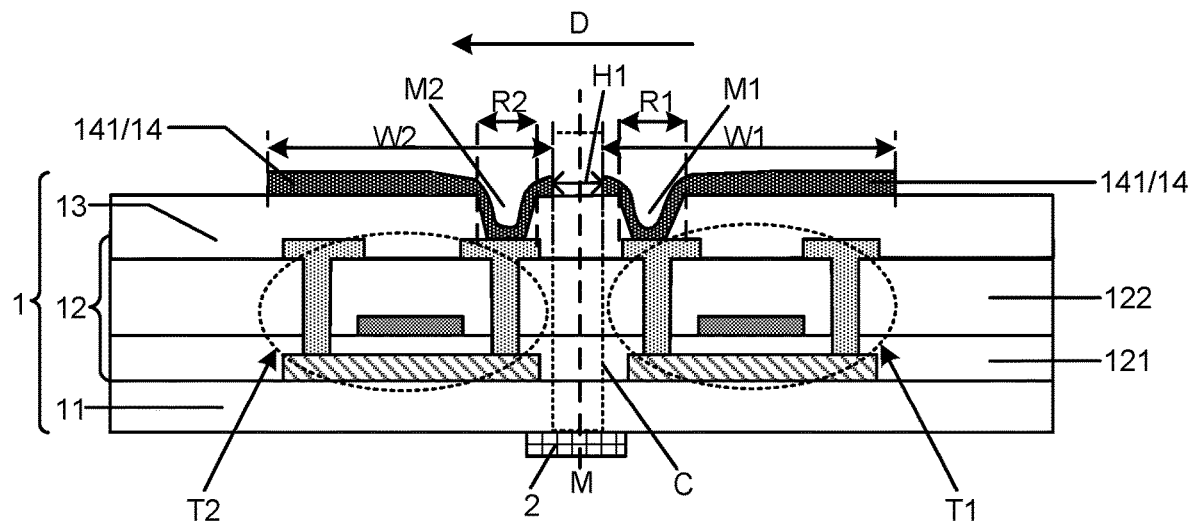
FIG. 10 is an illustration of a structure of yet another display substrate, in accordance with some embodiments of the present disclosure.

In some embodiments, as shown in FIG. 10, a diameter of the first via hole M1 is equal to a diameter of the second via hole M2. For example, the diameter R1 of the first via hole M1 is equal to the diameter R2 of the second via hole M2.

As shown in FIG. 10, the first via hole M1 and the second via hole M2 are symmetrical relative to a central axis M of the light-transmitting channel C.

As shown in FIG. 10, in a direction D pointing from the first via hole M1 to the second via hole M2, a dimension W1 of a portion of the conductive light-shielding pattern 141 located on one side of the first light-transmitting hole H1 is equal to or approximately equal to a dimension W2 of a portion of the conductive light-shielding pattern 141 located on another opposite side of the first light-transmitting hole H1.

Through the above arrangement, the diameters of the first via hole M1 and the second via hole M2 located on the two sides of the first light-transmitting hole H1 are equal, and positions of the two via holes are symmetrical. By making the dimensions of the portions of the conductive light-shielding pattern 141 located on the two sides of the first light-transmitting hole H1 equal or approximately equal, the degrees of the sags of the conductive light-shielding pattern 141 caused by the first via hole M1 and the second via hole M2 are made to be as uniform as possible, thereby further ensuring that the portions of the conductive light-shielding pattern 141 on the two opposite sides of the first light-transmitting hole H1 are located in the same horizontal plane, which may ensure an accuracy of the formed light-transmitting channel C.

Figure 11:
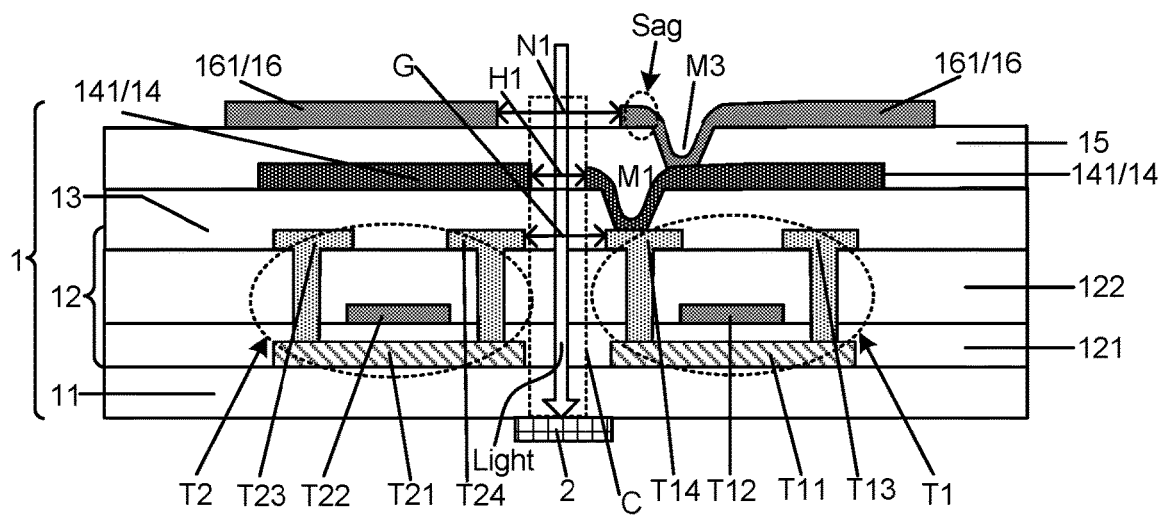
FIG. 11 is an illustration of a structure of yet another display substrate, in accordance with some embodiments of the present disclosure.
Figure 12:
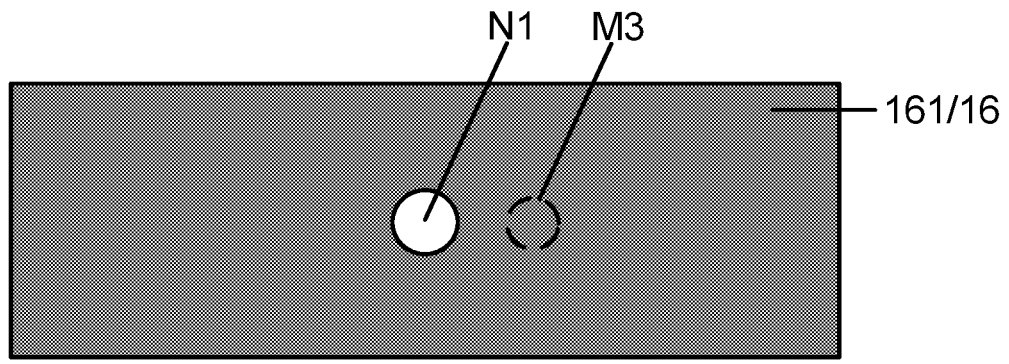
FIG. 12 is a top view illustration of a conductive electrode layer provided in the display substrate in FIG. 11.

In addition to the first conductive layer and the second conductive layer mentioned above, the display substrate 1 includes other conductive layers. In some embodiments, as shown in FIGS. 11 and 12, the display substrate 1 further includes a second insulating layer 15 and a conductive electrode layer 16.

The second insulating layer 15 is disposed on a side of the conductive light-shielding layer 14 away from the base 11, and has third via holes M3.

The conductive electrode layer 16 is disposed on a side of the second insulating layer 15 away from the base 11, and includes conductive electrodes 161. The conductive electrode 161 has a second light-transmitting hole N1 located in the photosensitive region AA1. An orthogonal projection of the second light-transmitting hole N1 on the base 11 and the orthogonal projection of the first light-transmitting hole H1 on the base 11 have a second overlapping region, so that the second light-transmitting hole N1, the first light-transmitting hole H1, and the gap region G between the first thin film transistor T1 and the second thin film transistor T2 cooperate to form at least a part of the light-transmitting channel C along the direction perpendicular to the base 11. The conductive electrode 161 is electrically connected with the conductive light-shielding pattern 141 through the third via hole M3.

In this way, on one hand, the conductive electrode layer 16 includes the conductive electrode 161 that may be used to form the second light-transmitting hole N1, so that the second light-transmitting hole N1 forms a part of the light-transmitting channel C required for the texture recognition, and cooperates with the first light-transmitting hole H1 formed in the conductive light-shielding layer 14 to jointly improve the recognition accuracy. On another hand, the conductive electrode 161 may further be electrically connected with the conductive light-shielding pattern 141, which is coupled with the source electrode T13 or the drain electrode T14 of the first thin film transistor T1, so that signals may be transmitted among the conductive electrode 161, the conductive light-shielding pattern 141 and the first thin film transistor T1. In this way, owing to multiple functions of the conductive electrode layer 16, the position where the thin film transistor is located or the metal layer structure may be more fully utilized, which may reduce the thickness of the display substrate 1 or the number of the processes, and facilitate the thin design of the display apparatus in the case where the display substrate 1 is applied to the display apparatus.

In the above embodiments, as shown in FIG. 12, the conductive electrode 161 is also an integral structure. The embodiments are described by taking an example in which the conductive electrode 161 is electrically connected with the conductive light-shielding pattern 141, and the conductive light-shielding pattern 141 is coupled with the first thin film transistor T1 to transmit signal, and the conductive light-shielding pattern 141 is not coupled with the second thin film transistor T2, and does not transmit signals to the second thin film transistor T2. That is, the second thin film transistor T2 is not in electrical contact with the conductive electrode 161, and signals received by or transmitted by the second thin film transistor T2 are not from the conductive electrode 161. If the conductive electrode 161 is coupled with the second thin film transistor T2, a signal transmission error may occur.

In some embodiments, materials and thicknesses of the first insulating layer 13 and the second insulating layer 15 are not limited. The first insulating layer 13 and the second insulating layer 15 may be made of organic resin, and a thickness of the organic resin layer may be in a range from 50 nm to 150 nm.

In some cases, the inventors of the present disclosure have found that, as shown in FIG. 11, if a via hole (i.e., the third via hole M3) is provided on one side of the second light-transmitting hole N1, yet no via hole is provided on another side of the second light-transmitting hole N1, the metal structure and the like are also prone to, e.g. sag, deform or tilt on the side provided with the via hole. Referring to FIG. 11, the conductive electrode 161 "sags" at a periphery of the third via hole M3, which causes that a portion of the conductive electrode 161 on a side of the second light-transmitting hole N1 proximate to the via hole is not in a same horizontal plane as portions of the conductive electrode 161 on other sides of the second light-transmitting hole N1, thereby affecting the regularity of the shape of the formed light-transmitting channel C, and the accuracy of the texture recognition.

Figure 13:
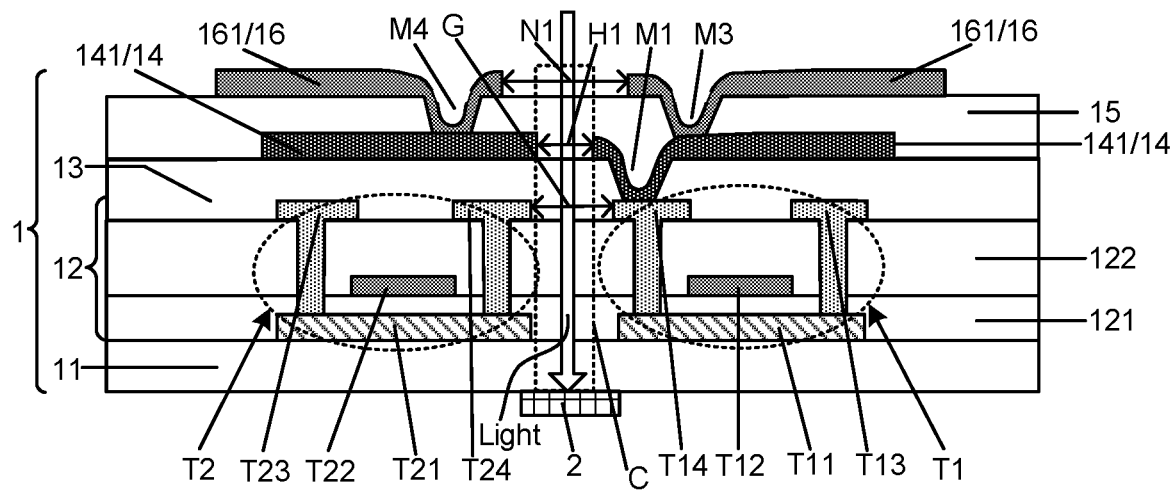
FIG. 13 is an illustration of a structure of yet another display substrate, in accordance with some embodiments of the present disclosure.
Figure 14:
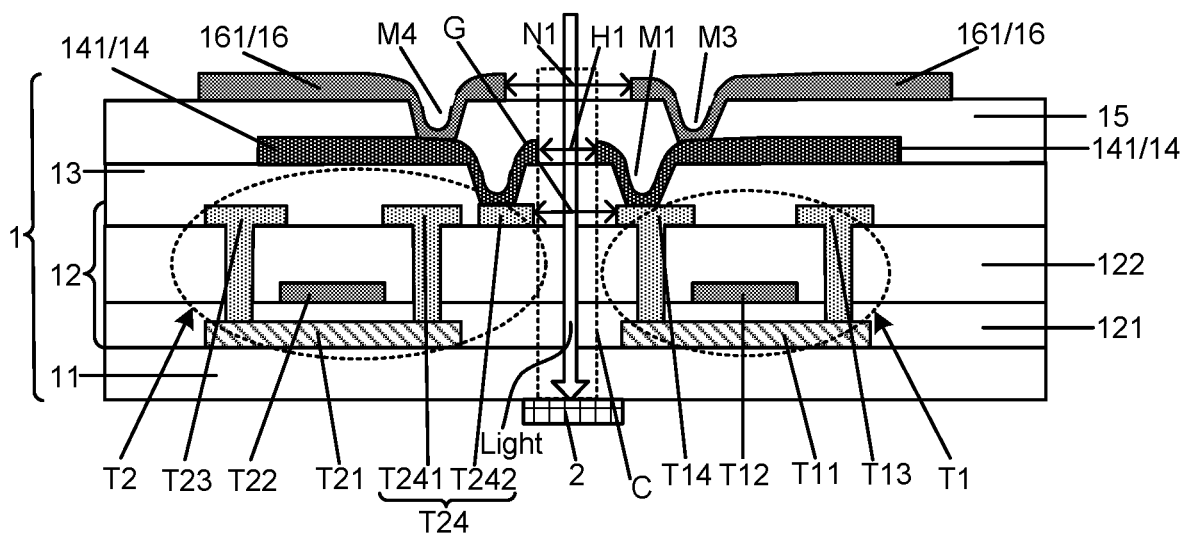
FIG. 14 is an illustration of a structure of yet another display substrate, in accordance with some embodiments of the present disclosure.
Figure 15:
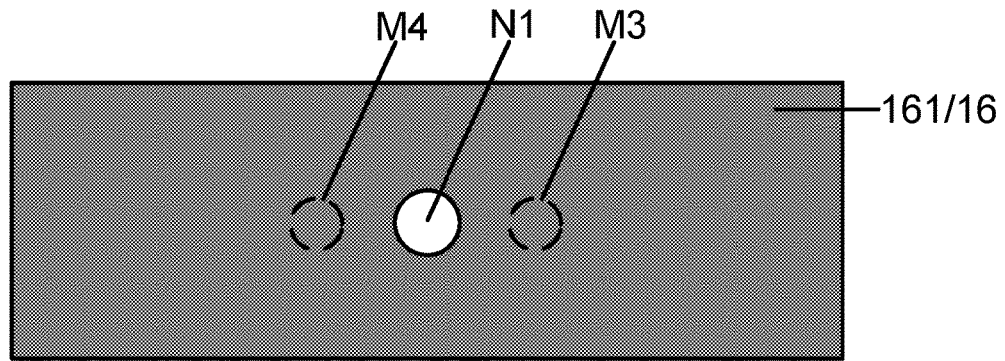
FIG. 15 is a top view illustration of a conductive electrode layer in the display substrate provided in FIG. 14.

On this basis, in some embodiments, as shown in FIGS. 13 to 15, the second insulating layer 15 further has fourth via holes M4. The third via hole M3 and the fourth hole M4 are respectively located on two opposite sides of the second light-transmitting hole N1. The conductive electrode 161 is coupled with the conductive light-shielding pattern 141 through the fourth via hole M4, and there is no signal transmission between the conductive light-shielding pattern 141 and the second thin film transistor T2.

On a premise that the conductive light-shielding pattern 141 is an integral structure, that there is no signal transmission between the conductive light-shielding pattern 141 and the second thin film transistor T2 includes two cases. As shown in FIG. 13, the first insulating layer 13 only includes the first via holes M1, the conductive light-shielding pattern 141 is coupled with the first thin film transistor T1 through the first via hole M1, and the conductive light-shielding pattern 141 and the second thin film transistor T2 are electrically insulated from each other.

As shown in FIG. 14, the first insulating layer 13 further has the second via holes M2. One of the source electrode T23 and the drain electrode T24 of the second thin film transistor T2 proximate to the first light-transmitting hole H1 drain electrode includes the active layer connection portion T241 and the dummy portion T242 that are electrically insulated from each other, and the dummy portion T242 is closer to the first light-transmitting hole H1 than the active layer connection portion T241. The active layer connection portion T241 is coupled with the active pattern T21 of the second thin film transistor T2. The conductive light-shielding pattern 141 is coupled with the dummy portion T242 through the second via hole M2. In this way, since the dummy portion T242 is separate from other portions of the second thin film transistor T2, there is no signal transmission between the conductive light-shielding pattern 141 and the second thin film transistor T2.

In the above two cases, the conductive electrode 161 is an integral structure, and the conductive electrode 161 is coupled with the conductive light-shielding pattern 141 through the fourth via hole M4 in the second insulating layer 15. In this way, there is no signal transmission between the conductive electrode 161 and the second thin film transistor T2.

In the above embodiments, by providing the via holes (i.e., the third via hole M3 and the fourth via hole M4) on both sides of the second light-transmitting hole N1, it is possible to improve a problem that the portions of the conductive electrode 161 on two opposite sides of the second light-transmitting hole N1 are not in the same horizontal plane due to the sag of the conductive electrode 161 at the via hole caused by providing the via hole on only one side of the second light-transmitting hole N1. It will be understood as that, since the two sides of the second light-transmitting hole N1 are both provided with the via holes, the conductive electrode 161 sags at the via holes on the two sides of the second light-transmitting hole N1, thereby offsetting a height difference between the portions of the conductive electrode 161 on the two opposite sides of the second light-transmitting hole N1, and improving the accuracy of the texture recognition.

In addition, since the conductive light-shielding pattern 141 are electrically insulated from other portions of the second thin film transistor T2 other than the dummy portion T242, the conductive electrode 161 is not electrically connected to the other portions of the second thin film transistor T2 other than the dummy portion T242 through the conductive light-shielding pattern 141, and there is no signal transmission between the conductive electrode 161 and the second thin film transistor T2. In this way, it is possible to not only solve the problem that the portions of the conductive electrode 161 on the two opposite sides of the second light-transmitting hole N1 are not in the same horizontal plane, but also avoid the signal transmission error caused by the signal transmission between the conductive electrode 161 and the second thin film transistor T2.

Figure 16:
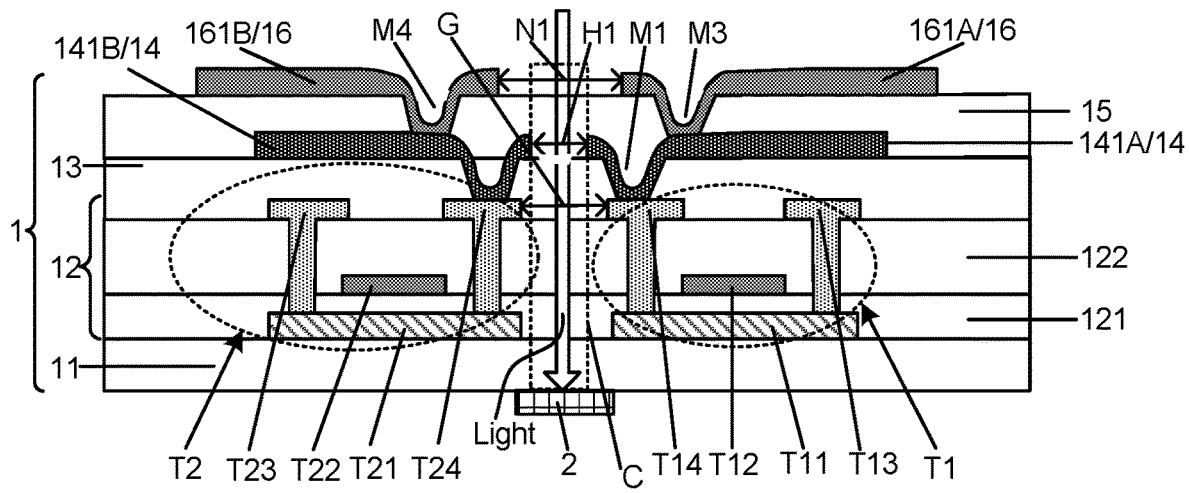
FIG. 16 is an illustration of a structure of yet another display substrate, in accordance with some embodiments of the present disclosure.

In some other embodiments, as shown in FIG. 16, in a case where the conductive light-shielding pattern 141 includes the first light-shielding sub-pattern 141A and the second light-shielding sub-pattern 141B that are electrically insulated from each other, the conductive electrode 161 includes a first conductive sub-electrode 161A and a second conductive sub-electrode 161B that are electrically insulated from each other. The first conductive sub-electrode 161A is coupled with the first light-shielding sub-pattern 141A through the third via hole M3, and the second conductive sub-electrode 161B is coupled with the second light-shielding sub-pattern 141B through the fourth via hole M4.

In the above embodiments, by providing the via holes (i.e., the third via hole M3 and the fourth via hole M4) on the two sides of the second light-transmitting hole N1, it is possible to improve the problem that the portions of the conductive electrode 161 on the two opposite sides of the second light-transmitting hole N1 are not in the same horizontal plane due to the sag of the conductive electrode 161 at the via hole caused by providing the via hole on only one side of the second light-transmitting hole N1. It will be understood that, since both sides of the second light-transmitting hole N1 are provided with the via holes, the conductive electrode 161 sags at the via holes on the two sides of the second light-transmitting hole N1, thereby offsetting the height difference between the portions of the conductive electrode 161 on the two opposite sides of the second light-transmitting hole N1, and improving the accuracy of the texture recognition.

Moreover, since in the above embodiments, the second thin film transistor T2 is coupled with the second light-shielding sub-pattern 141B and is not coupled with the first light-shielding sub-pattern 141A, there is no signal transmitted between the second thin film transistor T2 and the conductive light-shielding pattern 141. Therefore, by dividing the conductive light-shielding pattern 141 into the first light-shielding sub-pattern 141A and the second light-shielding sub-pattern 141B that are electrically insulated from each other, and using the first light-shielding sub-pattern 141A as the portion of the conductive light-shielding pattern 141 for the signal transmission with the thin film transistor, the first light-shielding sub-pattern 141A is coupled with the first thin film transistor T1 through the first via hole M1, thereby realizing the signal transmission between the first light-shielding sub-pattern 141A and the thin film transistor T1. Since the first light-shielding sub-pattern 141A and the second light-shielding sub-pattern 141B are electrically insulated from each other, even if the second light-shielding sub-pattern 141B is coupled with the second thin film transistor T2, the first light-shielding sub-pattern 141A and the second thin film transistor T2 are not coupled, and there is no signal transmission between the two. In this way, it is possible to not only solve the problem that the portions of the conductive light-shielding pattern 141 on the two opposite sides of the first light-transmitting hole H1 are not located in the same horizontal plane, but also avoid the signal transmission error caused by the signal transmission between the first light-shielding sub-pattern 141A in the conductive light-shielding pattern 141 and the second thin film transistor T2.

In some embodiments", in a direction D pointing from the third via hole M3 to the fourth via hole M4, a distance between the first conductive sub-electrode 161A and the second conductive sub-electrode 161B may be greater than a size of the light-transmitting channel C. In addition, an orthographic projection of the first conductive sub-electrode 161A on the base 11 completely covers an orthographic projection of the first thin film transistor T1 on the base 11, and an orthographic projection of the second conductive sub-electrode 161B on the base 11 completely covers an orthographic projection of the second thin film transistor T2 on the base 11.

Herein, in the direction D pointing from the third via hole M3 to the fourth via hole M4, the distance between the first conductive sub-electrode 161A and the second conductive sub-electrode 161B may be in a range from 6 um to 20 um.

Figure 17A:
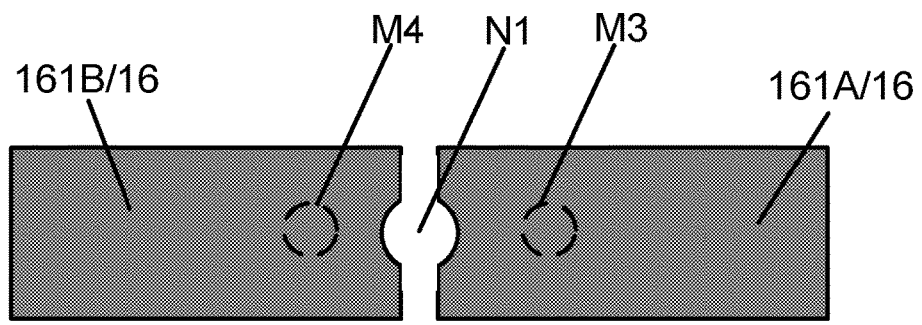
FIG. 17A is a top view illustration of a conductive electrode layer in the display substrate provided in FIG. 16.
Figure 17B:
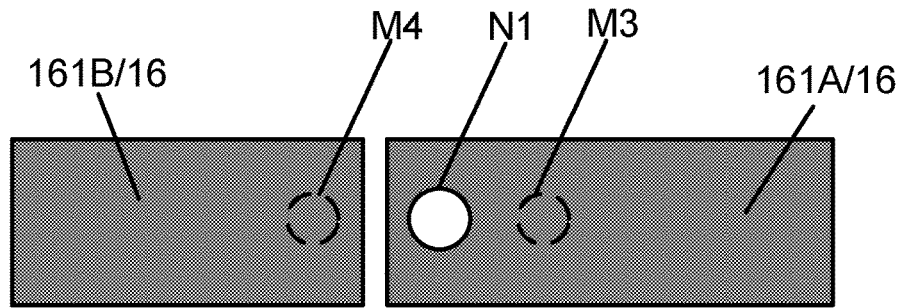
FIG. 17B is another top view of the conductive electrode layer in the display substrate provided in FIG. 16.
Figure 17C:
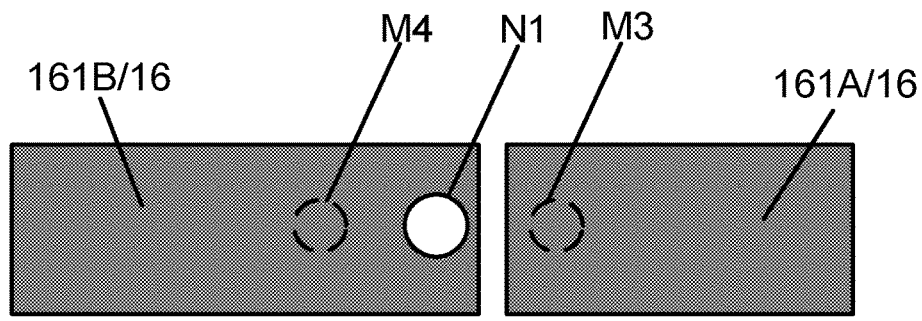
FIG. 17C is yet another top view of the conductive electrode layer in the display substrate provided in FIG. 16.

In some embodiments, a positional relationship among the second light-transmitting hole N1, the first conductive sub-electrode 161A and the second conductive sub-electrode 161B includes the following cases. For example, as shown in FIG. 17B, the second light-transmitting hole N1 is located in the first conductive sub-electrode 161A. Or, as shown in FIG. 17C, the second light-transmitting hole N1 is located in the second conductive sub-electrode 161B. Or, as shown in FIG. 17A, a part of the second light-transmitting hole N1 is located in the first conductive sub-electrode 161A, and another part of the second light-transmitting hole N1 is located in the second conductive sub-electrode 161B, so that the first conductive sub-electrode 161A and the second conductive sub-electrode 161B cooperate to form the second light-transmitting hole N1.

Figure 18:
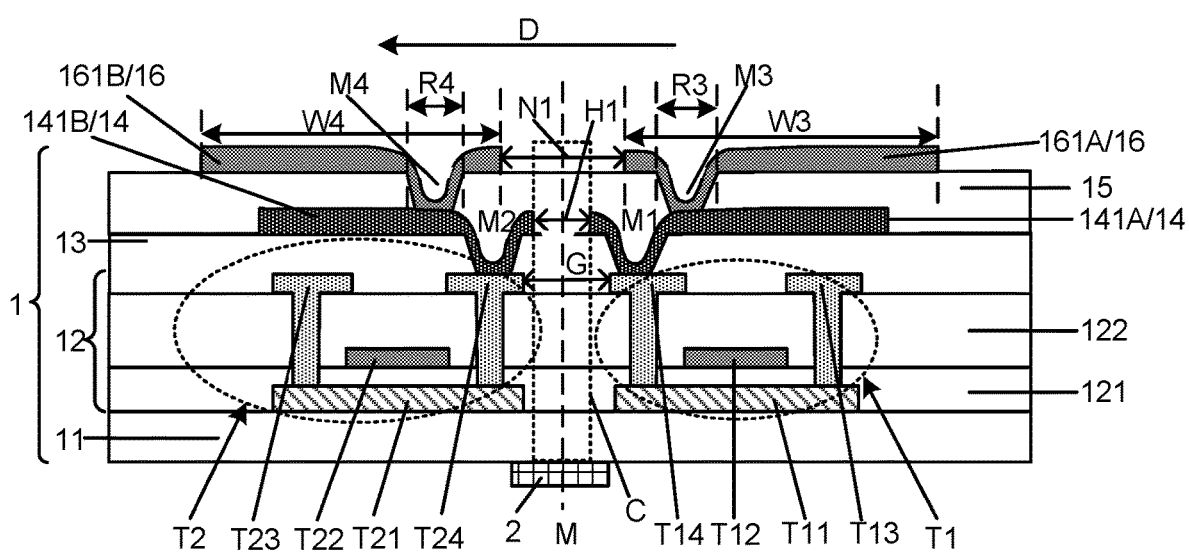
FIG. 18 is an illustration of yet another structure of a display substrate, in accordance with some embodiments of the present disclosure.

In some embodiments, as shown in FIG. 18, a diameter of the third via hole M3 is equal to a diameter of the fourth via hole M4. For example, the diameter R3 of the third via hole M3 is equal to the diameter R4 of the fourth via hole M4.

As shown in FIG. 18, the third via hole M3 and the fourth via hole M4 are symmetrical relative to the central axis M of the light-transmitting channel C.

As shown in FIG. 18, in the direction D pointing from the third via hole M3 to the fourth via hole M4, a dimension W3 of a portion of the conductive electrode 161 located on one side of the second light-transmitting hole N1 is equal to or approximately equal to a dimension W4 of a portion of the conductive electrode 161 located on another opposite side of the second light-transmitting hole N1.

Through the above arrangement, the diameters of the third via hole M3 and the fourth via hole M4 located on the two sides of the second light-transmitting hole N1 are equal, and positions of the two via holes are symmetrical. By making the dimensions of the portions of the conductive electrode 161 located on both sides of the second light-transmitting hole N1 equal or approximately equal, the degrees of the sags of the conductive electrode 161 caused by the third via hole M3 and the fourth via hole M4 are made to be as uniform as possible, thereby further ensuring that the two opposite sides of the second light-transmitting hole N1 are located in the same horizontal plane, which may ensure the accuracy of the formed light-transmitting channel C.

In some embodiments, as shown in FIG. 18, in a case where the first insulating layer 13 has the first via hole M1 and the second insulating layer 15 has the third via hole M3, the first via hole M1 and the third via hole M3 are staggered from each other in the direction perpendicular to the base 11. In a case where the first insulating layer 13 has the second via hole M2 and the second insulating layer 15 has the fourth via hole M4, the second via hole M2 and the fourth via hole M4 are staggered from each other in the direction perpendicular to the base 11.

That is, orthogonal projections of the first via hole M1 and the third via hole M3 on the base 11 do not overlap; and/or, orthogonal projections of the second via hole M2 and the fourth via hole M4 on the base 11 do not overlap. In this way, it is possible to avoid failures in electrical connections between the first conductive sub-electrode 161A and the first light-shielding sub-pattern 141A, and between the second conductive sub-electrode 161B and the second light-shielding sub-pattern 141B due to an over-etching problem.

Optionally, in the direction D, distances between the second via hole M2 and the light-transmitting channel C, and between the fourth via hole M4 and the light-transmitting channel C are in a range from 0.5 μm to 3 μm.

Compared with that the distances between the second via hole M2 and the light-transmitting channel C, and between the fourth via hole M4 and the light-transmitting channel C in the direction D are greater than 3 um, by providing the distances between both the second via hole M2 and the light-transmitting channel C, and the fourth via hole M4 and the light-transmitting channel C in the direction D to be in the range from 0.5 um to 3 um, it is possible to further improve the problem that the portions of the conductive light-shielding pattern 141 on two opposite sides of the light-transmitting channel C are not in a same horizontal plane, and the portions of the conductive electrode 161 on the two opposite sides of the light-transmitting channel C are not in a same horizontal plane.

In some embodiments, the display substrate 1 further includes a light-emitting device layer disposed on a side of the second insulating layer away from the base. The light-emitting device layer includes the conductive electrode layer 16, a light-emitting layer, and a cathode layer that are sequentially stacked. The light-emitting device layer includes a plurality of light-emitting devices, and each light-emitting device includes an anode located in the conductive electrode layer 16, a light-emitting portion located in the light-emitting layer, and a cathode located in the cathode layer.

In some examples, if the display substrate 1 is an OLED display panel, the light-emitting device is an OLED device, and the OLED device includes a first electrode, an organic light-emitting functional layer, and a second electrode that are all sequentially stacked. The first electrode is the anode and the second electrode is the cathode; or, the first electrode is the cathode and the second electrode is the anode. The organic light-emitting functional layer is the light-emitting portion.

In order to prevent light emitted from the OLED device from being incident to the texture recognition device 2, which may affect a texture recognition effect of the texture recognition device 2, the OLED device is a top light-emitting device.

On this basis, the OLED device further includes a hole injection layer, a hole transport layer, and an electron barrier layer that are arranged between the anode and the organic light-emitting functional layer, and an electron injection layer, an electron transport layer, and a hole barrier layer that are arranged between the cathode and the organic light-emitting functional layer.

The hole injection layer, the hole transport layer, and the electron barrier layer are sequentially arranged on the anode, and the electron injection layer, the electron transport layer, and the hole barrier layer are sequentially arranged on the cathode.

If the display panel is a QLED display panel, the light-emitting device is a QLED light-emitting device, and the QLED device includes a first electrode, a quantum dot light-emitting layer, and a second electrode that are all sequentially stacked. The first electrode is the anode and the second electrode is the cathode; or, the first electrode is the cathode and the second electrode is the anode. The quantum dot light-emitting layer is the light-emitting portion.

In order to prevent light emitted from the OLED device from being incident to the texture recognition device 2, which may affect the texture recognition effect of the texture recognition device 2, the QLED device is a top light-emitting device.

If the display panel is a LED display panel, the light-emitting device is a LED light-emitting unit.

In some embodiments, the display substrate 1 further includes a pixel defining layer disposed on a side of the second insulating layer away from the base, and the pixel defining layer is configured to define positions of the plurality of light-emitting devices.

Figure 20:
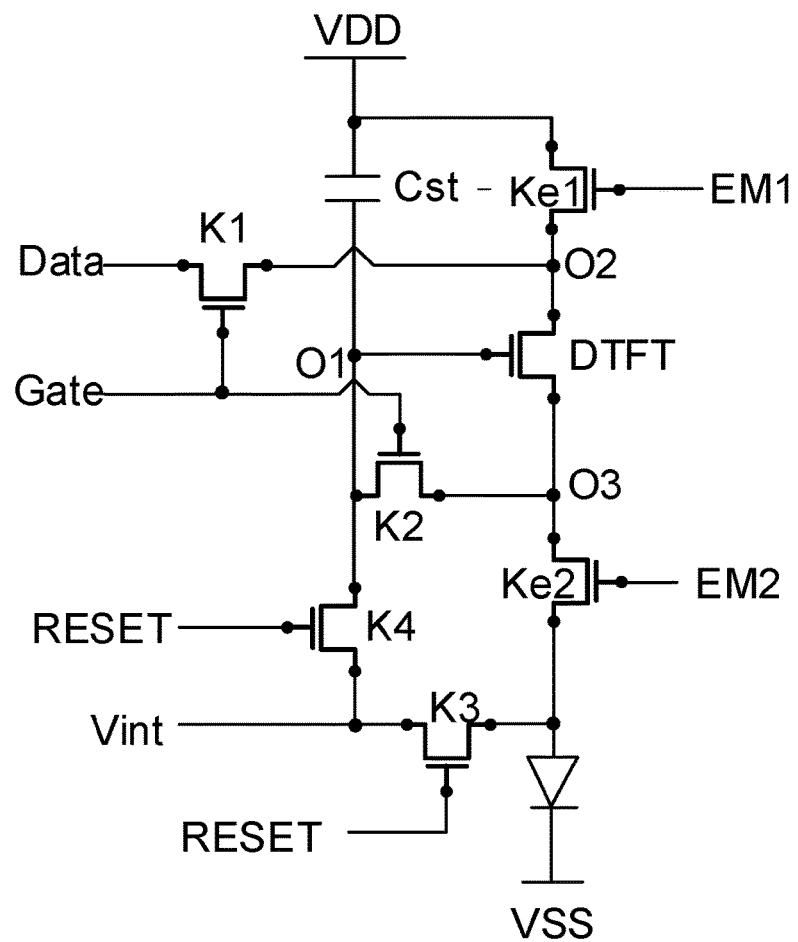
FIG. 20 is an illustration of a structure of a pixel circuit, in accordance with some embodiments of the present disclosure.

As shown in FIG. 20, for example, a pixel circuit includes a switching transistor K1, a driving transistor DTFT, a first light-emitting control transistor Ke1, a second light-emitting control transistor Ke2, and an initialization transistor K3. The second light-emitting control transistor Ke2 is coupled with a light-emitting device. The switching transistor K1 is coupled with a data signal line Data, the first light-emitting control transistor Ke1 is coupled with a first voltage signal terminal VDD, and the initialization transistor K3 is coupled with an initialization signal terminal Vinit.

Of course, the pixel circuit may further include other components, such as a second transistor K2, a fourth transistor K4, and a storage capacitor Cst.

It will be understood that, FIG. 20 is merely an example, and control signals or timings for the thin film transistors K1, Ke1, Ke2, K3, K4 and DTFT may be set as desired. For example, signals for Ke1 and Ke2 may be synchronous or the same.

Of course, FIG. 20 merely shows an exemplary circuit diagram and an exemplary implementation thereof, and some other circuit diagrams and implementations are also feasible.

In some embodiments, referring to FIGS. 18 and 20, the first thin film transistor T1 is used as the first light-emitting control transistor Ke1. The conductive light-shielding layer 14 further includes power signal lines that are coupled with the conductive light-shielding patterns 141. The power signal line is coupled with the source electrode T13 (or the drain electrode T14) of the first light-emitting control transistor Ke1 through the first via hole M1.

Or, referring to FIGS. 18 and 20, the first thin film transistor T1 is used as the second light-emitting control transistor Ke2, and the conductive electrode 161 is used as the anode of the light-emitting device. The anode of the light-emitting device is coupled with the first conductive light-shielding sub-pattern 141A through the third via hole M3, and the first conductive light-shielding sub-pattern 141A is coupled with the source electrode T13 (or the drain electrode T14) of the second light-emitting control transistor Ke2 through the first via hole M1.

Or, referring to FIGS. 18 and 20, the first thin film transistor T1 is the switching transistor K1. The conductive light-shielding layer 14 further includes data signal lines that are coupled with the conductive light-shielding patterns 141. The data signal line is coupled with the source electrode T13 (or the drain electrode T14) of the switching transistor K1 through the first via hole M1.

Or, referring to FIGS. 18 and 20, the first thin film transistor T1 is used as the initialization transistor K3. The conductive light-shielding layer 14 further includes initialization signal lines that are coupled with the conductive light-shielding patterns 141. The initialization signal line is coupled with the source electrode T13 (or the drain electrode T14) of the initialization transistor K3 through the first via hole M1.

The above merely provides several examples of a connection relationship of the first thin film transistors T1 in the pixel circuit, which is not a limitation on possibilities of the first thin film transistor T1 and the second thin film transistor T2.

In some embodiments, as shown in FIG. 18, an orthographic projection of the conductive light-shielding pattern 141 on the base 11 covers orthographic projections of channel regions of the first thin film transistor T1 and the second thin film transistor T2 on the base 11.

The channel region of the first thin film transistor T1 is a region between the source electrode T13 and the drain electrode T14 of the first thin film transistor T1. The channel region of the second thin film transistor T2 is a region between the source electrode T23 and the drain electrode T24 of the second thin film transistor T2.

In this way, it is possible to prevent characteristics of the first thin film transistor T1 and the second thin film transistor T2 from being affected by light irradiated on the channel regions of the first thin film transistor T1 and the second thin film transistor T2.

Or, the orthographic projection of the conductive light-shielding pattern 141 on the base 11 completely covers the orthographic projections of the first thin film transistor T1 and the second thin film transistor T2 on the base 11.

By making the orthographic projection of the conductive light-shielding pattern 141 on the base 11 completely cover the orthographic projections of the first thin film transistor T1 and the second thin film transistor T2 on the base 11, on one hand, it is possible to prevent parasitic capacitances from being generated between an electrode layer and conductive structures (such as the source electrodes and the drain electrodes) in the first thin film transistor T1 and the second thin film transistor T2; on another hand, it is possible to prevent the light passing through light-transmitting regions in the first thin film transistor T1 and the second thin film transistor T2 from being irradiated on the texture recognition device 2, which may affect the accuracy of the texture recognition.

In some embodiments, as shown in FIG. 2, the photosensitive region AA is provided with a plurality of sub-pixels which include sub-pixels of at least two colors, and areas of sub-pixels of different colors are not exactly equal. In sub-pixels of each color, at least one sub-pixel has the first light-transmitting hole. Among sub-pixels of different colors, a ratio of an area of each first light-transmitting hole to an area of a sub-pixel in which the first light-transmitting hole is located is the same or approximately the same.

For example, the area of the first light-transmitting hole located in the sub-pixel regions of different colors may be proportional to the area of the sub-pixel in which the first light-transmitting hole is located. For example, an area of a blue sub-pixel is greater than an area of a red sub-pixel, and an area of a first light-transmitting hole in the blue sub-pixel is greater than an area of a first light-transmitting hole in the red sub-pixel.

For example, the first light-transmitting holes may be provided in sub-pixels of a same kind, such as in blue sub-pixels (B). The first light-transmitting holes or imaging holes may also be provided in sub-pixels of different kinds, such as in red sub-pixels (R) and green sub-pixels (G).

In some embodiments, a plurality of first light-transmitting holes may be arranged in a straight line, or may be arranged irregularly. For example, in the blue sub-pixels (B) and the green sub-pixels (G), the first light-transmitting holes are arranged in a same straight line. Or, among three sub-pixels of a blue sub-pixel (B), a green sub-pixel (G) and a red sub-pixel (R), there are at least two sub-pixels of which first light-transmitting holes are not in a same straight line.

In some embodiments, shapes of the orthogonal projections of the first light-transmitting hole, the second light-transmitting hole and the light-transmitting channel on the base 11 are not limited. As shown in FIG. 2, the orthogonal projection of the light-transmitting channel on the base 11 may have a circular shape, an elliptical shape, or a rectangular shape.

As described above, as shown in FIG. 18, the display apparatus includes the display substrate 1 and at least one texture recognition device 2.

The at least one texture recognition device 2 is disposed on a side of the pixel circuit layer 12 away from the first insulating layer 13, and is located in the photosensitive region AA1 of the display substrate 1. In the display substrate 1, an orthogonal projection of at least one light-transmitting channel C on the base is within an orthographic projection of the texture recognition device 2 on the base 2.

In some embodiments, as shown in FIG. 18, the texture recognition device 2 may be disposed on a side of the base 11 away from the first insulating layer 13; or, the texture recognition device 2 may be disposed on a side of the base 11 proximate to the first insulating layer 13.

In addition, the texture recognition device 2 may also be disposed on an individual circuit board. For example, the texture recognition device 2 is disposed on an individual circuit board, and then the circuit board is integrated on the array substrate.

Of course, the texture recognition device 2 may further be formed on the display substrate 1, for example, by using a patterning process of the pixel circuits. For example, the texture recognition device 2 may be fabricated through a same process as the thin film transistors in the pixel circuits. For example, the texture recognition device 2 may be disposed on a side of the display substrate proximate to the conductive light-shielding layer 14, or on a side away of the display substrate from the conductive light-shielding layer 14.

In some embodiments, the texture recognition device 2 may be a device that can converts optical signals into electrical signals, such as a photodiode or a photosensitive diode.

In some embodiments, the texture recognition device 2 is a smallest unit capable of performing the texture recognition.

A texture recognition device 2 may include a plurality of photoelectric sensors or a plurality of photosensitive sensors.

The forgoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having an active area, the active area including a photosensitive region having a light-transmitting channel, the display substrate comprising:
   a base;
   a pixel circuit layer disposed on the base, the pixel circuit layer including a plurality of pixel circuits located in the active area, and at least one pixel circuit including a first thin film transistor and a second thin film transistor;
   a first insulating layer disposed on a side of the pixel circuit layer away from the base, the first insulating layer having a first via hole; and
   a conductive light-shielding layer disposed on a side of the first insulating layer away from the base, wherein the conductive light-shielding layer includes a conductive light-shielding pattern that has a first light-transmitting hole located in the photosensitive region; an orthogonal projection of the first light-transmitting hole on the base and an orthogonal projection of a gap region between the first thin film transistor and the second thin film transistor on the base have a first overlapping region, the light-transmitting channel is perpendicular to the base and penetrates the first overlapping region;
   the conductive light-shielding pattern is coupled with a source electrode or a drain electrode of the first thin film transistor through the first via hole.

2. The display substrate according to claim 1, wherein the conductive light-shielding pattern is coupled with one of the source electrode and the drain electrode, proximate to the first light-transmitting hole, of the first thin film transistor through the first via hole;
   the first insulating layer further has a second via hole;
   one of a source electrode and a drain electrode, proximate to the first light-transmitting hole, of the second thin film transistor includes an active layer connection portion and a dummy portion that are electrically insulated from each other, and the dummy portion is closer to the first light-transmitting hole than the active layer connection portion;
   the active layer connection portion is coupled with an active layer of the second thin film transistor; and
   the conductive light-shielding pattern is coupled with the dummy portion through the second via hole.

3. The display substrate according to claim 1, wherein the conductive light-shielding pattern includes a first light-shielding sub-pattern and a second light-shielding sub-pattern that are electrically insulated from each other;
   the first light-shielding sub-pattern is coupled with one of the source electrode and the drain electrode, proximate to the first light-transmitting hole, of the first thin film transistor through the first via hole;
   the first insulating layer further has a second via hole;
   the second light-shielding sub-pattern is coupled with one of a source electrode and a drain electrode, proximate to the first light-transmitting hole, of the second thin film transistor through the second via hole.

4. The display substrate according to claim 3, wherein the first light-transmitting hole is located in the first light-shielding sub-pattern; or
   the first light-transmitting hole is located in the second light-shielding sub-pattern; or
   one part of the first light-transmitting hole is located in the first light-shielding sub-pattern, and another part of the first light-transmitting hole is located in the second light-shielding sub-pattern, so that the first light-shielding sub-pattern and the second light-shielding sub-pattern cooperate to form the first light-transmitting hole.

5. The display substrate according to claim 1, wherein a diameter of the first via hole is equal to a diameter of the second via hole.

6. The display substrate according to claim 1, wherein the first via hole and the second via hole are symmetrical relative to a central axis of the light-transmitting channel.

7. The display substrate according to claim 1, wherein in a direction pointing from the first via hole to the second via hole, a dimension of a portion of the conductive light-shielding pattern located on one side of the first light-transmitting hole is approximately equal to a dimension of a portion of the conductive light-shielding pattern located on an opposite side of the first light-transmitting hole.

8. The display substrate according to claim 1, further comprising:
   a second insulating layer disposed on a side of the conductive light-shielding layer facing away from the base, the second insulating layer having a third via hole and a fourth hole; and
   a conductive electrode layer disposed on a side of the second insulating layer facing away from the base, wherein
   the conductive electrode layer includes a conductive electrode, the conductive electrode has a second light-transmitting hole located in the photosensitive region; an orthogonal projection of the second light-transmitting hole on the base and an orthogonal projection of the first light-transmitting hole on the base have a second overlapping region, the light-transmitting channel is further penetrates the second overlapping region;
   the conductive electrode is coupled with the conductive light-shielding pattern through the third via hole, the third via hole and the fourth hole are respectively located on two opposite sides of the second light-transmitting hole.

9. The display substrate according to claim 8, wherein a diameter of the third via hole is equal to a diameter of the fourth via hole.

10. The display substrate according to claim 8, wherein the third via hole and the fourth via hole are symmetrical relative to a central axis of the light-transmitting channel.

11. The display substrate according to claim 8, wherein in a direction pointing from the third via hole to the fourth via hole, a dimension of a portion of the conductive electrode located on one side of the second light-transmitting hole is approximately equal to a dimension of a portion of the conductive electrode located on an opposite side of the second light-transmitting hole.

12. The display substrate according to claim 8, wherein
in the direction perpendicular to the base, the first via hole and the third via hole are staggered from each other, and
the second via hole and the fourth via hole are staggered from each other.

13. The display substrate according to claim 8, further comprising a light-emitting device layer disposed on a side of the second insulating layer away from the base, the light-emitting device layer including the conductive electrode layer, a light-emitting layer and a cathode layer that are sequentially stacked, wherein
the light-emitting device layer includes a plurality of light-emitting devices, each light-emitting device includes: an anode located in the conductive electrode layer, a light-emitting portion located in the light-emitting layer, and a cathode located in the cathode layer; and
the pixel circuit includes: a switching transistor, a driving transistor, a first light-emitting control transistor, a second light-emitting control transistor and an initialization transistor, wherein the second light-emitting control transistor is coupled with the light-emitting device, wherein
the first thin film transistor is the first light-emitting control transistor; and the conductive light-shielding layer further includes a power signal line, the power signal line is coupled with the conductive light-shielding pattern; or
the first thin film transistor is the second light-emitting control transistor, and the conductive electrode is the anode of the light-emitting device; or
the first thin film transistor is the switching transistor; and the conductive light-shielding layer further includes a data signal line, the data signal line is coupled with the conductive light-shielding pattern; or
the first thin film transistor is the initialization transistor; and the conductive light-shielding layer further includes an initialization signal line, the initialization signal line is coupled with the conductive light-shielding pattern.

14. The display substrate according to claim 8, wherein one of a source electrode and a drain electrode, proximate to the first light-transmitting hole, of the second thin film transistor includes:
an active layer connection portion coupled with an active layer of the second thin film transistor; and
a dummy portion closer to the first light-transmitting hole than the active layer connection portion, the dummy portion and the active layer connection portion being electrically insulated from each other, wherein
the conductive light-shielding pattern is coupled with one of the source electrode and the drain electrode, proximate to the first light-transmitting hole, of the first thin film transistor through the first via hole, and is further coupled with the dummy portion through the second via hole, and
the conductive electrode is coupled with the conductive light-shielding pattern through the fourth via hole.

15. The display substrate according to claim 14, wherein the second light-transmitting hole is located in the first conductive sub-electrode; or
the second light-transmitting hole is located in the second conductive sub-electrode; or
a part of the second light-transmitting hole is located in the first conductive sub-electrode, and another part of the second light-transmitting hole is located in the second conductive sub-electrode, so that the first conductive sub-electrode and the second conductive sub-electrode cooperate to form the second light-transmitting hole.

16. The display substrate according to claim 8, wherein the conductive light-shielding pattern includes:
a first light-shielding sub-pattern, wherein the first light-shielding sub-pattern is coupled with one of the source electrode and the drain electrode, proximate to the first light-transmitting hole, of the first thin film transistor through the first via hole; and
a second light-shielding sub-pattern, wherein the second light-shielding sub-pattern and the first light-shielding sub-pattern are electrically insulated from each other, and the second light-shielding sub-pattern is coupled with one of a source electrode and a drain electrode, proximate to the first light-transmitting hole, of the second thin film transistor through the second via hole; and
the conductive electrode includes:
a first conductive sub-electrode, wherein the first conductive sub-electrode is coupled with the first light-shielding sub-pattern through the third via hole; and
a second conductive sub-electrode, wherein the second conductive sub-electrode and the first conductive sub-electrode are electrically insulated from each other, and the second conductive sub-electrode is coupled with the second light-shielding sub-pattern through the fourth via hole.

17. The display substrate according to claim 1, wherein an orthographic projection of a channel region of the first thin film transistor on the base and an orthographic projection of a channel region of the second thin film transistor on the base are within an orthographic projection of the conductive light-shielding pattern on the base.

18. The display substrate according to claim 1, further comprising a plurality of sub-pixels ac provided in the photosensitive region, wherein the plurality of sub-pixels include sub-pixels of at least two colors, and not all areas of sub-pixels of different colors are equal;
the first light-transmitting hole is located in at least one sub-pixel in each color of sub-pixels; and
among sub-pixels of different colors, a ratio of an area of each first light-transmitting hole to an area of the sub-pixel in which the first light-transmitting hole is located is approximately a same.

19. A display apparatus, comprising:
the display substrate according to claim 1; and
at least one texture recognition device disposed on a side of the pixel circuit layer away from the first insulating layer, wherein the at least one texture recognition device is located in the photosensitive region of the display substrate, and an orthogonal projection of at least one light-transmitting channel in the display substrate on the base is within an orthographic projection of the at least one texture recognition device on the base.

20. The display substrate according to claim 1, wherein the first insulating layer further having a second via hole, the first via hole and the second hole are respectively located on two opposite sides of the first light-transmitting hole.

* * * * *